US011545219B2

(12) United States Patent
Bedeschi et al.

(10) Patent No.: US 11,545,219 B2
(45) Date of Patent: Jan. 3, 2023

(54) MEMORY DEVICE WITH SINGLE TRANSISTOR DRIVERS AND METHODS TO OPERATE THE MEMORY DEVICE

(71) Applicant: Micron Technology, Inc., Boise, ID (US)

(72) Inventors: Ferdinando Bedeschi, Biassono (IT); Efrem Bolandrina, Fiorano al Serio (IT); Umberto Di Vincenzo, Capriate San Gervasio (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/975,619

(22) PCT Filed: Mar. 24, 2020

(86) PCT No.: PCT/IB2020/000107
§ 371 (c)(1),
(2) Date: Aug. 25, 2020

(87) PCT Pub. No.: WO2021/191644
PCT Pub. Date: Sep. 30, 2021

(65) Prior Publication Data
US 2022/0343979 A1 Oct. 27, 2022

(51) Int. Cl.
*G11C 7/00* (2006.01)
*G11C 16/04* (2006.01)
(Continued)

(52) U.S. Cl.
CPC ........ *G11C 16/0433* (2013.01); *G11C 16/102* (2013.01); *G11C 16/26* (2013.01); *G11C 16/32* (2013.01)

(58) Field of Classification Search
CPC ......... G11C 7/12; G11C 8/08; G11C 11/4091; G11C 11/415
(Continued)

(56) References Cited

U.S. PATENT DOCUMENTS 10,546,629 B1 * 1/2020 Vimercati ........... G11C 11/2275
2008/0062787 A1 3/2008 Lee et al.
(Continued)

FOREIGN PATENT DOCUMENTS

| CN | 110390975 A | 10/2019 |
| TW | I576841 B | 4/2017 |
| TW | 201947593 A | 12/2019 |

OTHER PUBLICATIONS

International Search Report and Written Opinion issued in PCT/US2020/000107, dated Dec. 10, 2020(10 pages).
(Continued)

*Primary Examiner* — Son T Dinh
(74) *Attorney, Agent, or Firm* — Fletcher Yoder, P.C.

(57) ABSTRACT

A memory device with single transistor drivers and methods to operate the memory device are described. In some embodiments, the memory device may comprise memory cells at cross points of access lines of a memory array, a first even single transistor driver configured to drive a first even access line to a discharging voltage during an IDLE phase, to drive the first even access line to a floating voltage during an ACTIVE phase, and to drive the first even access line to a read/program voltage during a PULSE phase, and a first odd single transistor driver configured to drive a first odd access line, the first odd access line physically adjacent to the first even access line, to the discharging voltage during the IDLE phase, to drive the first odd access line to the
(Continued)

floating voltage during the ACTIVE phase, and to drive the first odd access line to a shielding voltage during the PULSE phase.

25 Claims, 15 Drawing Sheets

(51) Int. Cl.
  *G11C 16/32* (2006.01)
  *G11C 16/26* (2006.01)
  *G11C 16/10* (2006.01)

(58) Field of Classification Search
  USPC .......................................................... 365/204
  See application file for complete search history.

(56) References Cited

U.S. PATENT DOCUMENTS

| | | |
|---|---|---|
| 2012/0224424 A1 | 9/2012 | Lee |
| 2013/0242686 A1 | 9/2013 | Zeng et al. |
| 2019/0180812 A1 | 6/2019 | Sung et al. |
| 2019/0325934 A1 | 10/2019 | Matsubara |
| 2020/0075091 A1 | 3/2020 | Louie et al. |

OTHER PUBLICATIONS

TW Office Action for TW Application No. 110106881, dated Oct. 26, 2021, 7 pages.

\* cited by examiner

MEMORY DEVICE WITH SINGLE TRANSISTOR DRIVERS AND METHODS TO OPERATE THE MEMORY DEVICE

BACKGROUND

The following relates generally to memory devices and more specifically to memory devices with single transistor drivers and methods thereof.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory cells may lose their stored state over time unless they are periodically refreshed by an external power source.

Cost reduction and device performance are increasingly relevant in most advanced memory devices. Scaling technology, e.g., adopting manufacturing techniques with smaller feature size however, is adding considerable processing cost. Some technologies, such as three-dimensional (3D) technologies, exploit the vertical dimension of the chip to form memory cells so as to improve the ratio between memory capacity and estate. Finding more cost effective and more performant design solutions is highly desirable, especially for array-related circuits, such as access line drivers.

DETAILED DESCRIPTION

Figure 1:
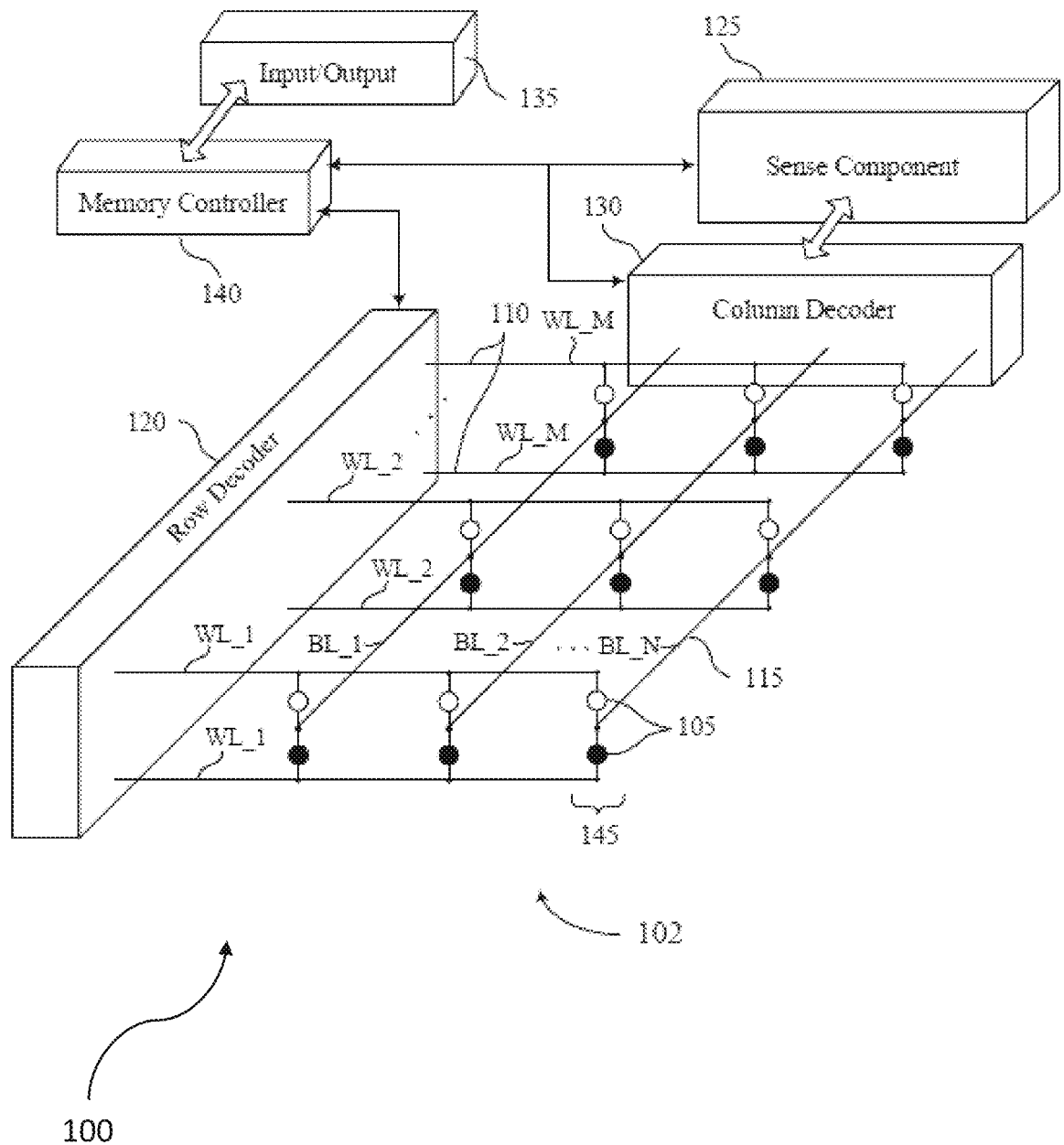
FIG. 1 illustrates an exemplary diagram of a memory device including an array of memory cells that supports single transistor drivers in accordance with embodiments of the present disclosure.

Digital information storage is more and more demanding. Different technologies are available to store bits of information in logical states of a memory cell. Independently of the physical mechanisms that allow information storage, a denser and denser packing is required. Additionally, performance must be constantly increased, for example in terms of shorter and shorter access time, and minimum power consumption is desirable, especially for mobile or battery supplied applications.

It is here disclosed a memory array architecture, especially suited for non-volatile data storage, that allows very dense packing of memory cells and very low consumption during operation. The memory architecture comprises single transistor drivers for driving access lines to a positive and a negative read/program voltage, depending on the command being executed. Memory cells may be at intersections of word lines and digit lines, e.g., in cross-point memory array organization, such as in a multi-deck 3D memory array. Read/program voltage splitting may be adopted to limit voltage stress in drivers and in memory cells and to reduce leakage in the array.

According to the disclosed solution, operation may be subdivided in some phases, such as an IDLE phase, an ACTIVE phase and a PULSE phase. The disclosure teaches how each access line is decoded and biased during each of the phases above. In particular, during an IDLE phase, all access lines are biased to a discharge voltage (e.g., a ground voltage), during an ACTIVE phase all access lines are biased to a floating voltage, and during a PULSE phase, addressed access lines are biased to the desired (positive or negative) read/program voltage while access lines that are physically adjacent to or grouped with the addressed lines are biased to a shielding voltage (e.g., a ground voltage) and unrelated access lines (e.g., neither adjacent to nor grouped with the addressed lines) are kept at a floating voltage. After execution of an access operation (e.g., on exiting from a PULSE phase) the memory device returns in an ACTIVE phase and stays there waiting until a new command is received. A threshold number of access operations and/or a timeout may be used to limit permanence in the ACTIVE phase and periodically trigger an IDLE phase.

The working conditions of the single transistor driver are such that transistor nodes are biased to voltages never exceeding maximum reliability transistor rating during any of the IDLE, ACTIVE and PULSE phases.

Features of the disclosure are initially described in the context of a memory device and memory die as described with reference to FIGS. 1-3. Features of the disclosure are described in the context of a driver or group of drivers as described with reference to FIGS. 4 and 5. Features of the disclosure are then described in the context of a drivers and array configurations as described with reference to FIGS. 6 to 11. Other features of the disclosure are further illustrated by phase diagram and corresponding methods described with reference to flowcharts that relate to operation of the memory device according to phases and described with references to FIGS. 12-14 and in relation to an apparatus diagram described with reference to FIG. 15.

FIG. 1 illustrates an example memory device 100 as disclosed herein. Memory device 100 may also be referred to as an electronic memory apparatus. FIG. 1 is an illustrative representation of various components and features of the memory device 100. As such, it should be appreciated that the components and features of the memory device 100 shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states. Although some elements included in FIG. 1 are labeled with a numeric indicator, other corresponding elements are not labeled, though they are the same or would be understood to be similar, in an effort to increase visibility and clarity of the depicted features.

The 3D memory array 102 may include two or more two-dimensional (2D) memory arrays 103 formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple memory cells laid on top of another while sharing an access line for both as explained below. In some cases, the memory cells may be multi-level memory cells configured to store more than one bit of data using multi-level storage techniques.

In some examples, each row of memory cells 105 is connected to a word line 110, and each column of memory cells 105 is connected to a bit line 115. The term access lines may refer to word lines 110, bit lines 115, or combinations thereof. Word lines 110 and bit lines 115 may be perpendicular (or nearly so) to one another and may create an array of memory cells. As shown in FIG. 1, the two memory cells 105 in a memory cell stack 145 may share a common conductive line such as a bit line 115. That is, a bit line 115 may be coupled with the bottom electrode of the upper memory cell 105 and the top electrode of the lower memory cell 105. Other configurations may be possible, for example, a third deck may share a word line 110 with a lower deck. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, word line 110 and bit line 115 may be energized to read or write a memory cell 105 at their intersection. Other memory cells 105 that are coupled with (e.g., connected to) the same word line 110 or bit line 115 may be referred to as untargeted memory cells 105.

Electrodes may be coupled with a memory cell 105 and a word line 110 or a bit line 115. The term electrode may refer to an electrical conductor, and in some cases, may be employed as an electrical contact to a memory cell 105. An electrode may include a trace, wire, conductive line, conductive material, or the like that provides a conductive path between elements or components of memory device 100. In some examples, a memory cell 105 may include a chalcogenide material positioned between a first electrode and a second electrode. One side of the first electrode may be coupled to a word line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or different.

Operations such as reading and writing may be performed on memory cells 105 by activating or selecting word line 110 and bit line 115. In some examples, bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate bit line 115. For example, memory array 102 may include multiple word lines 110, labeled WL_1 through WL_M, and multiple digit lines 115, labeled BL_1 through BL_N, where M and N depend on the array size. Thus, by activating a word line 110 and a bit line 115, e.g., WL_2 and BL_3, the memory cell 105 at their intersection may be accessed. As discussed below in more detail, accessing memory cells 105 may be controlled through a row decoder 120 and a column decoder 130 that may include one or more doped materials that extend in a direction away from a surface of a substrate coupled to the memory array 102.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105. In some examples, a memory cell 105 may be programmed by providing an electric pulse to the cell, which may include a memory storage element. The pulse may be provided via word line 110, bit line 115, or a combination thereof.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or coupled with column decoder 130 or row decoder 120. The sense component may be associated either with column decoder or row decoder.

A memory cell 105 may be set or written by activating the relevant word line 110 and bit line 115 and at least one logic value may be stored in the memory cell 105. Column decoder 130 or row decoder 120 may accept data, for example input/output 135, to be written to the memory cells 105. In the case of a memory cell including a chalcogenide material, a memory cell 105 may be written to store a logic state in the memory cell 105 by applying the first voltage to the memory cell 105 as part of the access operation based on coupling the first conductive line of the decoder (e.g., row decoder 120 or column decoder 130) with the access line (e.g., word line 110 or bit line 115).

The memory device 100 may be in an IDLE phase; an IDLE phase may be a configuration with low power consumption, for example. In some examples the memory device 100 may be in an ACTIVE phase; an ACTIVE phase may be a configuration in which the memory device is immediately ready to execute received commands, for example. In some examples, the memory device may be in a PULSE phase; a PULSE phase may be a configuration during which a command is executed, for example, e.g., a target memory cell is accessed and biased to program or to read a logic state into or from the memory cell.

Based on the memory device's phase (e.g., IDLE phase, ACTIVE phase or PULSE phase, among others), the memory controller 140 may control the operation and voltages (e.g., read, write, re-write, refresh, discharge, shield, float) of memory cells 105 through the various components, for example, row decoder 120, column decoder 130, and sense component 125. In some cases, one or more of the row decoder 120, column decoder 130, and sense component 125 may be co-located with the memory controller 140.

Memory controller 140 may generate row and column address signals to activate the desired word line 110 and bit line 115. Memory controller 140 may also generate and control various other voltages or currents used during the operation of memory device 100. For example, memory controller 140 may bias to a shielding voltage (e.g., a ground voltage) access lines adjacent to the target access line and/or access lines in a same group as the addressed access line. Memory controller 140 may also float other access lines unrelated to the addressed access line.

The memory controller 140 may be configured to select the memory cell 105 by applying a first voltage to the first conductive line of the decoder (e.g., row decoder 120 or column decoder 130). In some cases, the memory controller 140 may be configured to couple the first conductive line of the decoder with an access line (e.g., word line 110 or bit line 115) associated with the memory cell 105 based on selecting the memory cell 105. The memory controller 140 may be configured to apply the first voltage to the memory cell 105 based at least in part on coupling the first conductive line of the decoder with the access line.

In some examples, the memory controller 140 may be configured to apply a second voltage to a second conductive line of the decoder as part of the access operation. Applying the first voltage to the memory cell 105 may be based on applying the second voltage to the second conductive line. For example, the memory controller 140 may select the memory cell 105 based on an intersection of the first voltage and the second voltage. In some cases, a signal applied to the memory cell 105 as part of the access operation may have a positive polarity or a negative polarity.

In some examples, the memory controller 140 may receive a command comprising an instruction to perform the access operation on the memory cell 105 and identify an address of the memory cell 105 based on receiving the command. In some cases, applying the second voltage to the second conductive line may be based on identifying the address. If the access operation is a read operation, the memory controller 140 may be configured to output a logic state stored in the memory cell 105 based on applying the first voltage to the memory cell 105. If the access operation is a write operation, the memory controller 140 may store a logic state in the memory cell 105 based on applying the first voltage to the memory cell 105.

In some examples, the memory controller 140 may modify a state of the memory device 100 based on receiving the command. For example, the memory controller 140 may implement a transition from an IDLE phase to an ACTIVE phase based on receiving an access command. For example, the memory controller 140 may implement a transition from an ACTIVE phase to a PULSE phase based on receiving an access command. For example, the memory controller 140 may implement a transition from a PULSE phase back to an ACTIVE phase based on completion of a PULSE phase command. For example, the memory controller 140 may implement a transition from an ACTIVE phase back to an IDLE phase based on an access counter or a time counter meet respective threshold, as it will be described in detail below. For example, the memory controller 140 may keep memory device 100 in an ACTIVE phase if the access counter and the time counter are below respective threshold.

Figure 2:
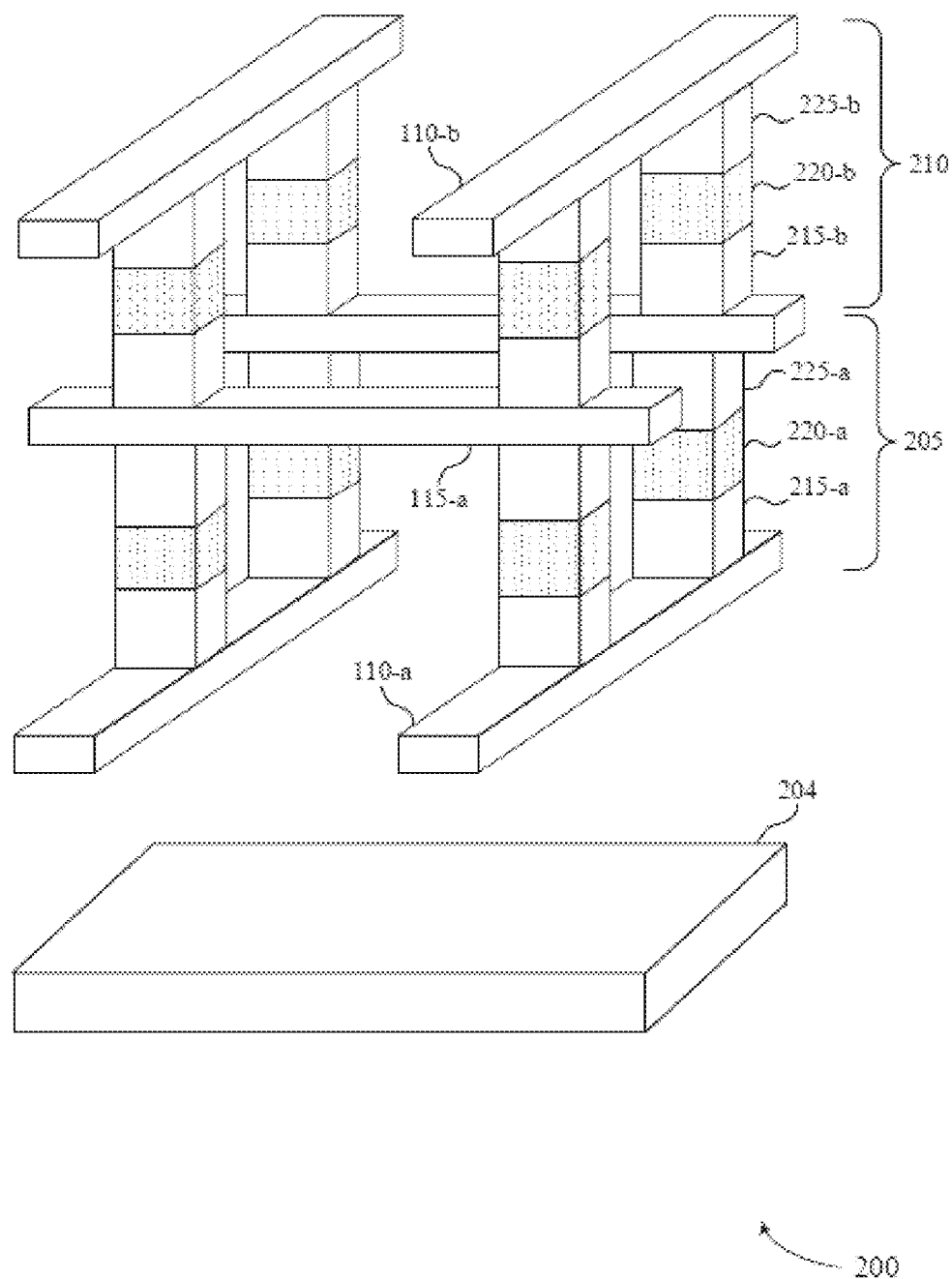
FIG. 2 illustrates a perspective view of an exemplary 3D memory array supporting single transistor drivers in accordance with embodiments of the present disclosure.

FIG. 2 illustrates a perspective view of an exemplary 3D memory array supporting single transistor drivers in accordance with embodiments of the present disclosure. Memory array 200 may be an example of portions of memory array 102 described with reference to FIG. 1. Memory array 200 may include a first array or deck 205 of memory cells that is positioned above a substrate 204 and second array or deck 210 of memory cells on top of the first array or deck 205. Memory array 200 may also include word line 110-*a* and word line 110-*b*, and bit line 115-*a*, which may be examples of word line 110 and bit line 115, as described with reference to FIG. 1. Memory cells of the first deck 205 and the second deck 210 each may have one or more memory cell (e.g., memory cell 220-*a* and memory cell 220-*b*, respectively). Although some elements included in FIG. 2 are labeled with a numeric indicator, other corresponding elements are not labeled, though they are the same or would be understood to be similar, in an effort to increase visibility and clarity of the depicted features.

Memory cells of the first deck 205 may include first electrode 215-*a*, memory cell 220-*a* (e.g., including chalcogenide material), and second electrode 225-*a*. In addition, memory cells of the second deck 210 may include a first electrode 215-*b*, memory cell 220-*b* (e.g., including chalcogenide material), and second electrode 225-*b*. The memory cells of the first deck 205 and second deck 210 may, in some examples, have common conductive lines such that corresponding memory cells of each deck 205 and 210 may share bit lines 115 or word lines 110 as described with reference to FIG. 1. For example, first electrode 215-*b* of the second deck 210 and the second electrode 225-*a* of the first deck 205 may be coupled to bit line 115-*a* such that bit line 115-*a* is shared by vertically adjacent memory cells. In accordance with the teachings herein, a decoder may be positioned above or below each deck if the memory array 200 includes more than one deck. For example, a decoder may be positioned above first deck 205 and above second deck 210. In some cases, the memory cells 220 may be examples of phase-change memory cells or self-selecting memory cells.

The architecture of memory array 200 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selection component. For example, DRAM may use a transistor, which is a three-terminal device, as the selection component for each memory cell and may have a larger memory cell area compared to the cross-point architecture.

While the example of FIG. 2 shows two memory decks, other configurations are possible. In some examples, a single memory deck of memory cells may be constructed above a substrate 204, which may be referred to as a two-dimensional memory. In some examples, a three or four memory decks of memory cells may be configured in a similar manner in a three-dimensional cross point architecture.

In some examples, one or more of the memory decks may include a memory cell 220 that includes chalcogenide material. The memory cell 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (Cl), or fluorine (F), each in atomic or molecular forms.

In some examples, a memory cell 220 including chalcogenide material may be programmed to a logic state by applying a first voltage. By way of example and without being bound by a particular theory, when a particular memory cell 220 is programed, elements within the cell separate, causing ion migration. Ions may migrate towards a particular electrode, depending on the polarity of the voltage applied to the memory cell. For example, in a memory cell 220, ions may migrate towards the negative electrode. The memory cell may then be read by applying a voltage across the cell to sense. The threshold voltage seen during a read operation may be based on the distribution of ions in the memory cell and the polarity of the read pulse.

In some cases, a first voltage may be applied to a first conductive line of a decoder as part of an access operation of the memory cell 220. Upon applying the first voltage, the first conductive line may be coupled with the access line (e.g., word line 110-*a*, word line 110-*b*, or bit line 115-*a*) associated with the memory cell 220. In some examples, a shielding voltage may be applied to a second conductive line of the decoder and the second conductive line may be coupled to an access line adjacent to the addressed access line or to an access line grouped with the addressed access line. In some examples, a floating voltage may be applied to a access lines that are neither adjacent to nor grouped with the addressed access line (e.g., other access lines in the same deck as the addressed access line—not shown in FIG. 2).

Figure 3:
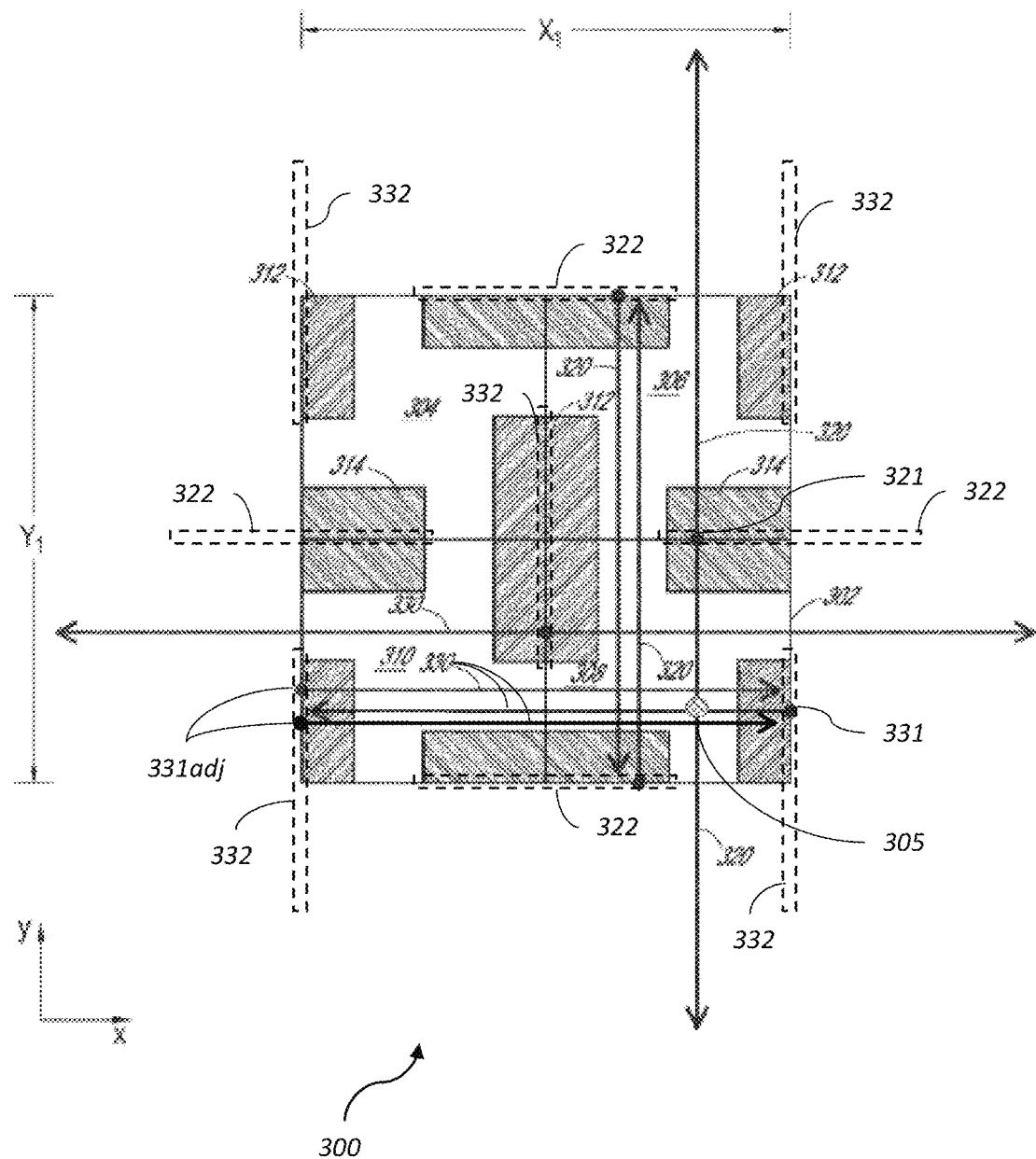
FIG. 3 illustrates an example block layout of decoding circuitry of a 3D memory array that supports single transistor drivers in accordance with embodiments of the present disclosure.

FIG. 3 illustrates an example block layout of decoding circuitry of a 3D memory array that supports single transistor drivers in accordance with embodiments of the present disclosure. In the example depicted in FIG. 3, a memory architecture 300 of the present invention comprises an active memory array 302 that is partitioned into multiple sub-arrays. In this example, there are four sub-arrays 304, 306, 308 and 310. Thus, a length of Y1 spanned by a digit line 320 extending towards one of the two opposite sides of the y-axis is equivalent to a length of two sub-arrays in the y-direction. Similarly, a length of X1 spanned by a word line 330 extending towards one of the two opposite sides of the x-axis is equivalent to a length of two sub-arrays in the x-direction.

Word line drivers 312 may be located substantially within the footprint of the active array and near the periphery of the sub-arrays. Digit line drivers 314 may also be located substantially within the footprint of the active array and near the periphery of the sub-arrays. It will be understood that each shaded area comprises a region that can include multiple driver circuits. In the illustrated embodiment, individual sub-array layouts in a plan view comprise a "mirror" copy of a layout of adjacent sub-arrays. That is, in sub-array 304 the word line drivers 312 are in the upper left and lower right corners of the sub-array, and extend generally along the edges along the y-direction to connect with word lines 330 extending in the x-direction. It is noted that the word line drivers 312 are coupled to a central location of the word lines, which cross boundaries between adjacent sub-arrays. The digit line drivers 314 are in the upper right and lower left corners of sub-array 304, and extend generally along the edges extending in the x-direction to connect with digit lines 320 extending in the y-direction.

Digit line drivers 314 are in the lower right and upper left corners of the sub-arrays, and extend generally along the edges that extending in the x-direction to connect with digit lines 330 that extend in the y-direction. It is noted that the digit line drivers 314 are coupled to a central location of the digit lines 330 which cross boundaries between adjacent sub-arrays. In adjacent sub-array 306 the word line drivers 312 are in the lower left and upper right corners of the sub-arrays, and extend generally along the vertical edges to connect with horizontally extending word lines. Thus in a plan view the layout of the drivers is a mirror image between adjacent sub-arrays 304 and 306. Similar mirroring can be seen between sub-arrays 304 and 310, between sub-arrays 306 and 308 and between sub-arrays 310 and 308, as depicted in FIG. 3.

In array architecture of FIG. 3, socket interconnect regions 322 for digit lines 320 and socket interconnect regions 332 for word lines 330 of the memory array 302 are present above digit drivers 314 and word line drivers 312, respectively. It is noted that the socket regions are at the boundaries of the sub-arrays. By breaking the word and digit line drivers and socket regions into small segments and staggering the lines or groups of lines in alternate rows, as illustrated in FIG. 3, the word lines and digit lines can extend through the active array 302 and through the socket regions.

A target or addressed memory cell 305 may be at the intersection of an addressed digit line 321 and an addressed word line 331; addressed digit line 321 and word line 331 are decoded and biased by respective driver 314 for digit line and 312 for word line. In the memory array 302, an addressed access line (for example addressed word line 331) has adjacent access lines (for example, word lines 330adj). During an access operation targeting the addressed word line (e.g., during a PULSE phase), the adjacent access lines are not addressed and may be biased to a shielding voltage through respective drivers, that may be single-transistor drivers in some embodiments. Similar considerations may apply to digit lines 320, so unaddressed digit lines (not shown) adjacent to the addressed digit line, may be biased to a shielding voltage, for example a ground voltage, during a PULSE phase.

It should be noted that, in the example depicted in FIG. 3, unaddressed word lines 331adj adjacent to the addressed word line 331, are decoded and biased by a respective driver 312 in the left-bottom portion of the Figure, while the addressed word line is decoded and biased by a driver 312 in the right-bottom portion of the Figure. In other embodiments, drivers 312 of addressed and of adjacent unaddressed word lines (and/or digit lines) may be physically located close to each other, e.g., in a same word line driver portion (respectively in a same digit line driver portion). The same driver portion may also comprise drivers of other unaddressed word lines (respectively digit lines), either grouped with the addressed word line or completely unrelated to it.

Other unaddressed access lines (either digit lines or word lines, or both) may be floated by respective driver during an access operation, as it will be described below. Some of the access lines may be grouped, for example may share a decoding signal, and unaddressed access lines in the same group of an addressed access line may be biased to a shielding voltage, e.g., a ground voltage, during a PULSE phase.

The access lines drivers, e.g., the word line drivers 312 and/or the digit line drivers 314 may comprise a single transistor driver. Each single transistor driver may be configured to drive a respective access line to a discharging voltage during an IDLE phase, to drive the access line to a floating voltage during an ACTIVE phase, and to drive the access line to a read/program voltage or to a shielding voltage or to a floating voltage during a PULSE phase, as it will be described in detail below.

Figure 4:
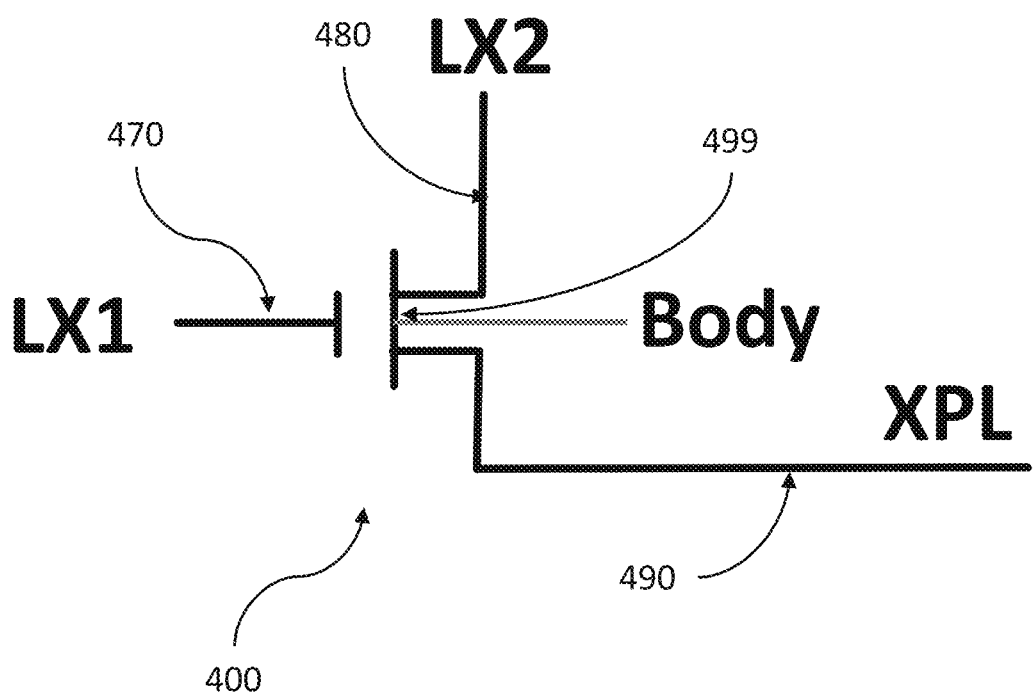
FIG. 4 illustrates an example of single transistor driver for a memory device in accordance with embodiments of the present disclosure.

FIG. 4 illustrates an example of single transistor driver for a memory device in accordance with embodiments of the present disclosure. Single transistor driver 400 may be a N-channel type transistor and it may comprise a gate node 470 coupled to signal line LX1, a drain node 480 coupled to signal line LX2, a body node 499 biased at voltage Body and a source node 490 coupled to an access line XPL. The voltage of the access line XPL may be determined based on decoding and biasing of the other nodes of the single transistor driver 400. In some embodiments the single transistor driver may be a N-type CMOS transistor; in some embodiments the single transistor driver may be a N-type FinFET transistor; in some embodiments the single transistor driver may be a N-type vertical Thin Film Transistor (TFT); in yet other embodiments the single transistor driver may be a P-type (e.g., a P-channel) transistor obtained by any of the previous technologies. Other types of transistors are also possible.

The single transistor driver 400 is suitable to drive an access line (e.g., word lines 110 and/or digit lines 115 in FIGS. 1 and 2, or word lines 330 and/or digit lines 320 in FIG. 3, for example) to the desired voltage during any of the operative phases of memory device 100. For example, driver 400 may be incorporated in row decoder 120 and/or in column decoder 130 of FIG. 1 or in word line drivers 312 and/or digit line drivers 314 of FIG. 3. Memory device, for example memory device 100 in FIG. 1, may operate in different states or phases; among the possible operative phases are: an IDLE phase, an ACTIVE phase and a PULSE phase.

Single transistor driver 400 may be configured to drive access line 490 (XPL) to a discharging voltage during an IDLE phase, to drive access line 490 (XPL) to a floating voltage during an ACTIVE phase, and to drive addressed access line 490 (XPL) to an access voltage (e.g., a read/program voltage) during a PULSE phase. The single transistor 400 is configured to drive an unaddressed access line 490 that is physically adjacent to an address access line (driven by a different single transistor driver) to a shielding voltage during the PULSE phase. The single transistor 400 is configured to drive an unaddressed access line 490 that is grouped with an addressed access line (driven by a different single transistor driver that shares, for example a common gate signal line with the access line 490) to a shielding voltage during the PULSE phase. The single transistor 400 is configured to drive an unaddressed access line 490 that is grouped with an addressed access line (driven by a different single transistor driver that shares, for example a common gate signal line with the access line 490) to a shielding voltage during the PULSE phase.

The discharging voltage may be a ground voltage (e.g., 0V) in some examples. The floating voltage may be a voltage that is not biased; the floating voltage may remain substantially unchanged with respect to the last biased voltage. In some cases, the floating voltage may be slightly modified by voltage of surrounding lines and nodes that may be capacitively coupled to the floating node. The access voltage may be a positive programming voltage (e.g., +3.1V) or a negative programming voltage (e.g., −3.1V). The shielding voltage may be a ground voltage (e.g., 0V) in some examples.

The voltage values above may be examples of access voltages for memory cells 105, 205, 305 when using a split voltage approach, for example. In a split voltage approach, the total voltage applied to a memory cell (e.g., the voltage drop between a digit line and a word line coupled to the memory cells) may be obtained by any convenient combination of respective voltages on the digit line and the word line. In some cases the total voltage may be split in two portions of substantially same amplitude but opposite polarity; so, for example, a program/read voltage of 6.2V may be obtained applying +3.1V at one node and concurrently applying −3.1V at the other node. A memory architecture may feature the single transistor driver here disclosed both to drive the digit line and to drive the word line. In the following description, reference is made to one access line driver only (e.g., the word line driver or the digit line driver), being understood that the same or a similar solution may be implemented to another access line driver (e.g., the digit line driver or the word line driver). The voltage values above are only indicative and operation of the single transistor driver 400 is essentially unchanged even if different values are targeted.

Generally speaking, the single transistor driver 400 is configured to transfer the voltage provided by signal line LX2 at its drain node 480 to the access line XPL coupled to its source node 490 based, at least in part, on a voltage provided by signal line LX1 at the gate node 470 of the transistor. In some examples, body node 499 voltage may be kept at an appropriate constant voltage (e.g., a voltage suitable to avoid forward biasing of any junction in the transistor 400) through signal line Body; for example, at a value −3.1V.

Example biasing conditions of access line XPL coupled to the source node 490 of the single transistor driver 400 during different phases are reported in Table I below, based on gate 470 and drain 480 nodes voltages respectively applied through control signal lines LX1 and LX2. In the example reported in Table I, body node voltage is assumed to be at a constant value −3.1V during all phases. Different voltages may be applied to the single transistor driver 400 through control signal lines LX1 and LX2 without departing from the scope of the invention.

TABLE 1

| PHASE Operation | Access line wrt to addressed Desired Effect | LX1 [Volts] | LX2 [Volts] | XPL [Volts] |
|---|---|---|---|---|
| IDLE Wait | All/any access line Apply Discharging Voltage | +1.5 | GND | GND |
| ACTIVE Ready to execute command | All/any access line Apply Floating Voltage | −3.1 | GND | FLOAT |
| PULSE Read/ | Addressed Apply Positive Read/ PRG Voltage | +4.5 | +3.1 | +3.1 |
| Program Positive | Adjacent to Apply Shielding Voltage | +1.5 | GND | GND |
| | Grouped with Apply Shielding Voltage | +4.5 | GND | GND |
| | Unrelated Apply Floating voltage | −3.1 | +3.1 | FLOAT |
| | Unrelated Apply Floating voltage | −3.1 | GND | FLOAT |
| | Unrelated Apply Shielding voltage | +1.5 | GND | GND |
| PULSE Read/ | Addressed Apply Negative Read/ PRG Voltage | +1.5 | −3.1 | −3.1 |

TABLE 1-continued

| PHASE Operation | Access line wrt to addressed Desired Effect | LX1 [Volts] | LX2 [Volts] | XPL [Volts] |
|---|---|---|---|---|
| Program Negative | Adjacent to Apply Shielding Voltage | +1.5 | GND | GND |
| | Grouped with Apply Shielding Voltage | +1.5 | GND | GND |
| | Unrelated Apply Floating voltage | −3.1 | GND | FLOAT |
| | Unrelated Apply Floating voltage | −3.1 | −3.1 | FLOAT |
| | Unrelated Apply Shielding voltage | +1.5 | GND | GND |

Single transistor driver 400 is configured to operate in such a way that transistor's nodes are respectively biased to voltages with differences not exceeding reliability transistor rating during any of the IDLE, ACTIVE and PULSE phases. In other words, the voltage difference between, for example, the gate node 470 and the drain node 480 never exceed a maximum reliability rating for the transistor during any of the operative phases. Similarly, gate-to-body (470 to 499), gate-to-source (470-to-490), drain-to-body (480-to-499), drain-to-source (480-to-490) and source-to-body (490-to-499) voltage differences are within the respective maximum reliability ratings during each and all the operative phases, e.g., IDLE, ACTIVE and/or PULSE phase.

As described above, e.g., with reference to biasing conditions reported in Table I, single transistor driver 400 may drive an access line XPL coupled to it to any desired voltage during any operation phase of memory device 100. Single transistor drivers 400 may be grouped in groups to share one or more control signal lines, as depicted in the following Figures.

Figure 5:
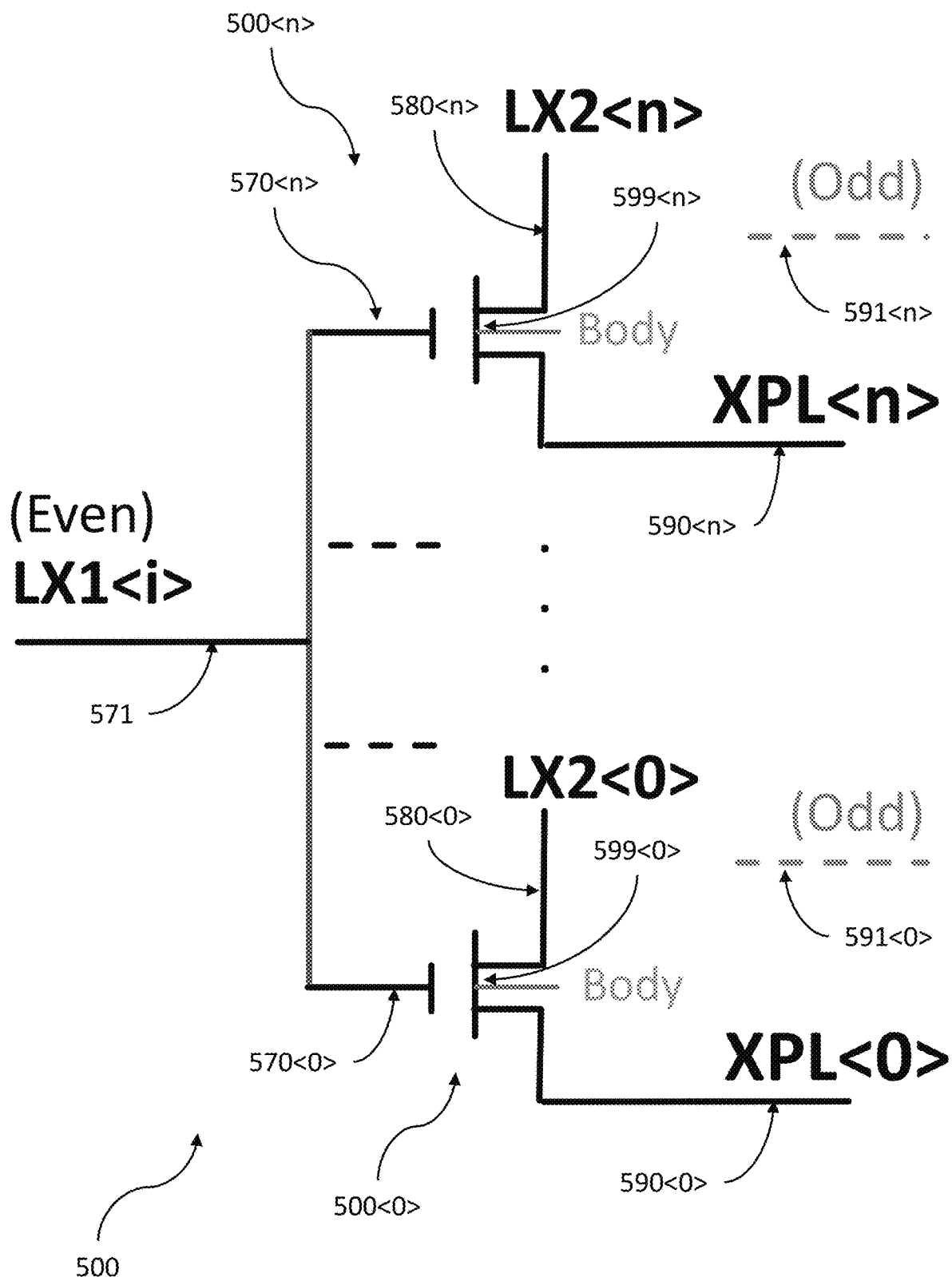
FIG. 5 illustrates an example of grouping single transistor drivers in a memory device in accordance with embodiments of the present disclosure.

FIG. 5 illustrates an example of grouping single transistor drivers in a memory device in accordance with embodiments of the present disclosure. A plurality of single transistor drivers 500<0> . . . 500<n> may be grouped in a group 500 sharing one or more control signal lines. In the depicted example, a first single transistor driver 500<0> is configured to transfer the voltage provided by signal line LX2<0> at its drain node 580<0> to the access line XPL<0> coupled to its source node 590<0> based, at least in part, on a voltage at the gate node 570<0> of the transistor 500<0>. A second single transistor driver 500<n> is configured to transfer the voltage provided by signal line LX2<n> at its drain node 580<n> to the access line XPL<n> coupled to its source node 590<n> based, at least in part, on a voltage at the gate node 570<n> of the transistor 500<n>. Gate nodes 570<0> of the first transistor 500<0> and gate node 570<n> of the second transistor 500<n> may be coupled to each other and driven by a common control signal line 571 LX<i>. Body nodes 599<0> and 599<n> of respective transistors may be a common node Body, in some examples. Other single transistor drivers (not shown) may be coupled to the common control signal line 571 LX1<i>, that may be an even signal line (e.g., coupled to an even group 500 of transistor drivers 500<0>500<n>).

Memory device 100 may comprise a plurality of even drivers organized in even groups 500, each driver 500<0> . . . 500<n> coupled to a respective even access line 590<0> . . . 590<n> (XPL<0> . . . XPL<n>), and a plurality of odd drivers (not shown) organized in odd groups, each driver coupled to a respective odd access line 591<0> . . . 591<n>. In some examples, even 590<0> . . . 590<n> and odd 591<0> . . . 591<n> access lines may alternate in an array 102 of the memory device 100. With reference to FIGS. 5 and 1, an even access line 590<0> . . . 590<n> (XPL<0> . . . XPL<n>) may be an example of word line WL_2 (or, alternatively, of digit line BL_2) and an odd access lines 591<0> . . . 591<n> may be an example of word line WL_1 (or, alternatively, of digit line BL_1) that is physically adjacent to the even access line. Even and odd access lines may be access lines in a same deck (e.g., lower deck 205 or upper deck 210 in FIG. 2) of the memory device 100 or 200. Single transistor drivers may be examples of word line drivers 312 and/or digit line drivers 314 of memory array 302, as described with reference to FIG. 3.

FIGS. 6 to 11 illustrate example configurations of single transistor drivers during different phases of operation of the memory device. Single transistor drivers may correspond to single transistor drivers as described with reference to FIG. 4 and they may be grouped as illustrated with reference to FIG. 5, in some examples.

Figure 6:
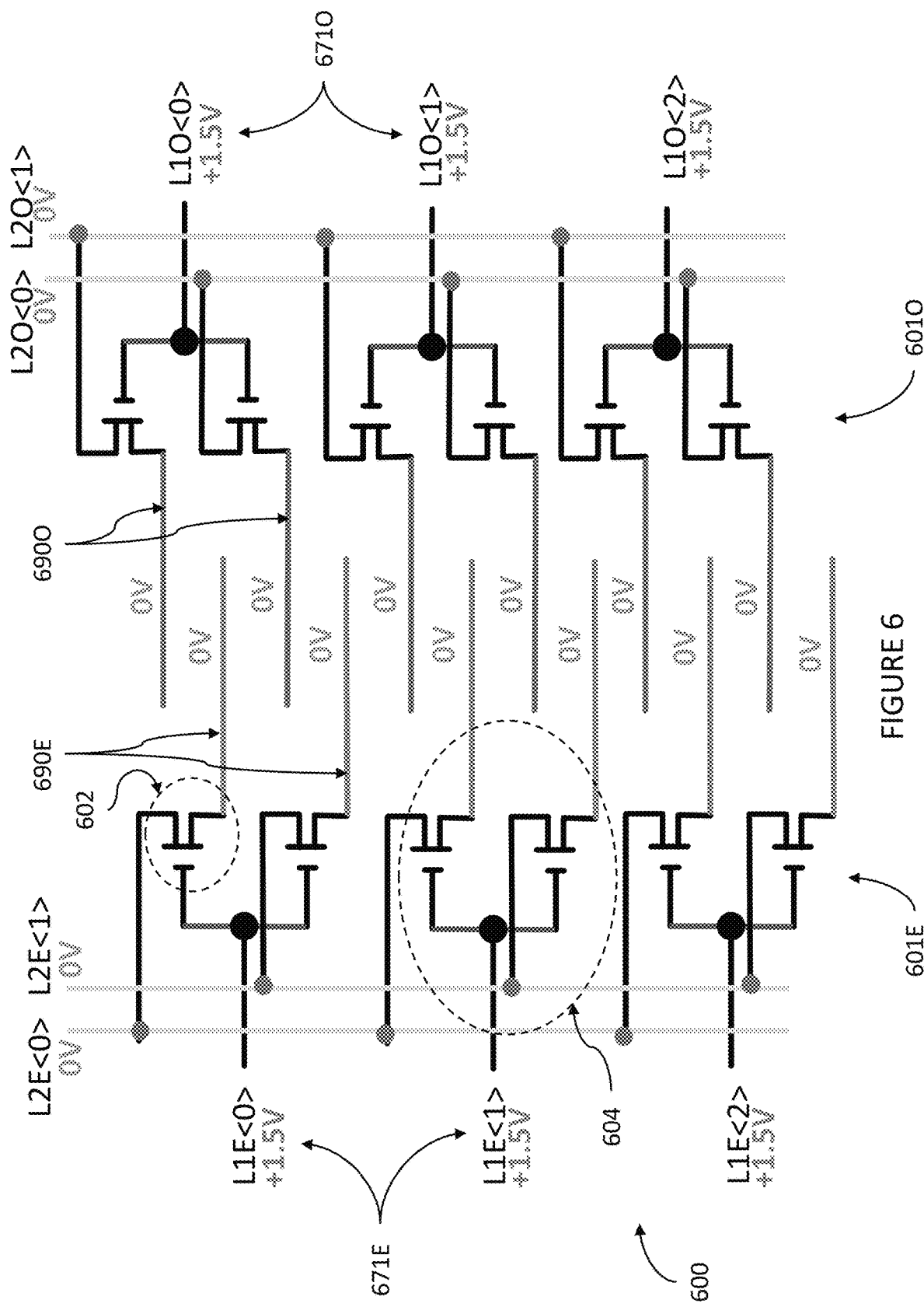
FIG. 6 illustrates an example configuration during an IDLE phase of a memory device that supports single transistor drivers in accordance with embodiments of the present disclosure.

FIG. 6 illustrates an example configuration during an IDLE phase of a memory device that supports single transistor drivers in accordance with embodiments of the present disclosure. A portion of a memory array 600, that may be n example of memory array 102, 200 and/or 302, comprises a plurality of even drivers 601E and a plurality of odd drivers 601O. Drivers 601E and 601O may be located under the memory array, in some examples. Despite even 601E and odd 601O drivers are depicted far apart from each other, in a similar fashion as drivers in different portions 312 and or 314 depicted in FIG. 3, in some embodiments, even 601E and odd 601O drivers may be realized in a same driver region.

Each plurality od even/odd drivers may be organized in groups 604 of single transistor drivers 602, that may be examples of group 500 of single transistor drivers 500<0> . . . 500<n> and/or 400 described above with reference to FIGS. 4 and 5.

Gate nodes of single transistor drivers are coupled to respective (even/odd) control signal line 671O and 671E. A number of single transistor drivers may be grouped and respective gate nodes may be coupled to a same gate control signal line; for example, this is depicted for group 604 including a pair of single transistor drivers, the gate nodes of which are driven by signal 671 named L1E<1>, that may correspond to common signal 571 LX1<i> for group 500 in FIG. 5—a different number of transistor drivers may be grouped as described above.

Drain nodes of single transistor drivers are coupled to respective (even/odd) control signal line L2E<0> L2E<1> and L2O<0> L2O<1> in a similar fashion as described with reference to control signal lines LX2 in FIGS. 4 and 5.

Each single transistor driver is coupled to respective (even/odd) access line 690E and 690O, that may be examples of access lines XPL and/or 110, 115 and/or 320, 330 in FIGS. 1-5. Even 690E and odd 690O access lines may alternate, so that an even access line is always physically adjacent to an odd access line in a memory array deck, or vice-versa. Other dispositions are possible.

During an IDLE phase, the gate and drain control signal lines may be biased as depicted in FIG. 6 and summarized in the corresponding row of Table I above. A discharging voltage, for example a ground voltage, may be applied to each and all access lines 690. The memory cells in the memory array are therefore subject to a null disturb and there is no consumption in the array. This desired result may be achieved by applying a pass gate voltage (e.g., +1.5V) to the gate control signal lines 671E and 671O and by applying the discharge voltage, e.g., 0V, to the drain control signal lines L2E and L2O. The body node voltage may be kept at a constant voltage of, for example, −3.1V.

Figure 7:
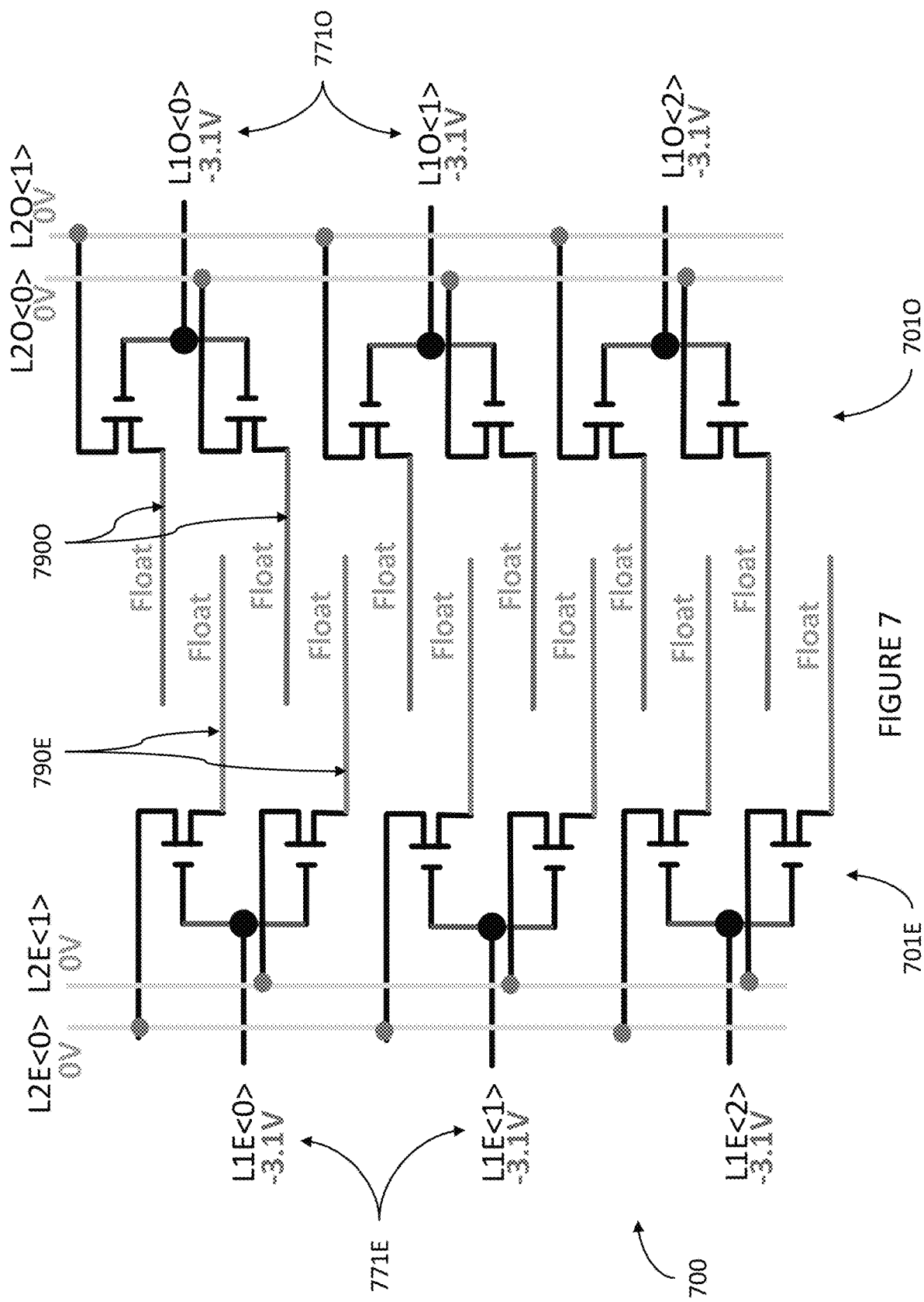
FIG. 7 illustrates an example configuration during an ACTIVE phase of a memory device that supports single transistor drivers in accordance with embodiments of the present disclosure.

FIG. 7 illustrates an example configuration during an ACTIVE phase of a memory device that supports single transistor drivers in accordance with embodiments of the present disclosure. Elements in FIG. 7 correspond to equivalent elements in FIG. 6 and the description will not be repeated; it is noted that corresponding elements have the same label with first digit in the number aligned to the corresponding Figure number (e.g., access lines 690E and 690O in FIG. 6 are labeled 790E and 790O, respectively, in FIG. 7).

During an ACTIVE phase, the gate and drain control signal lines may be biased as depicted in FIG. 7 and summarized in the corresponding row of Table I above. A floating voltage, e.g., a not biased voltage, may be applied to each and all access lines 790. The memory cells in the memory array are therefore subject to a null disturb and there is no consumption in the array. This desired result may be achieved by applying a inhibit gate voltage (e.g., −3.1V) to the gate control signal lines 771E and 771O and by applying a ground voltage, e.g., 0V, to the drain control signal lines L2E and L2O. The body node voltage may be kept at a constant voltage of, for example, −3.1V.

Figure 8:
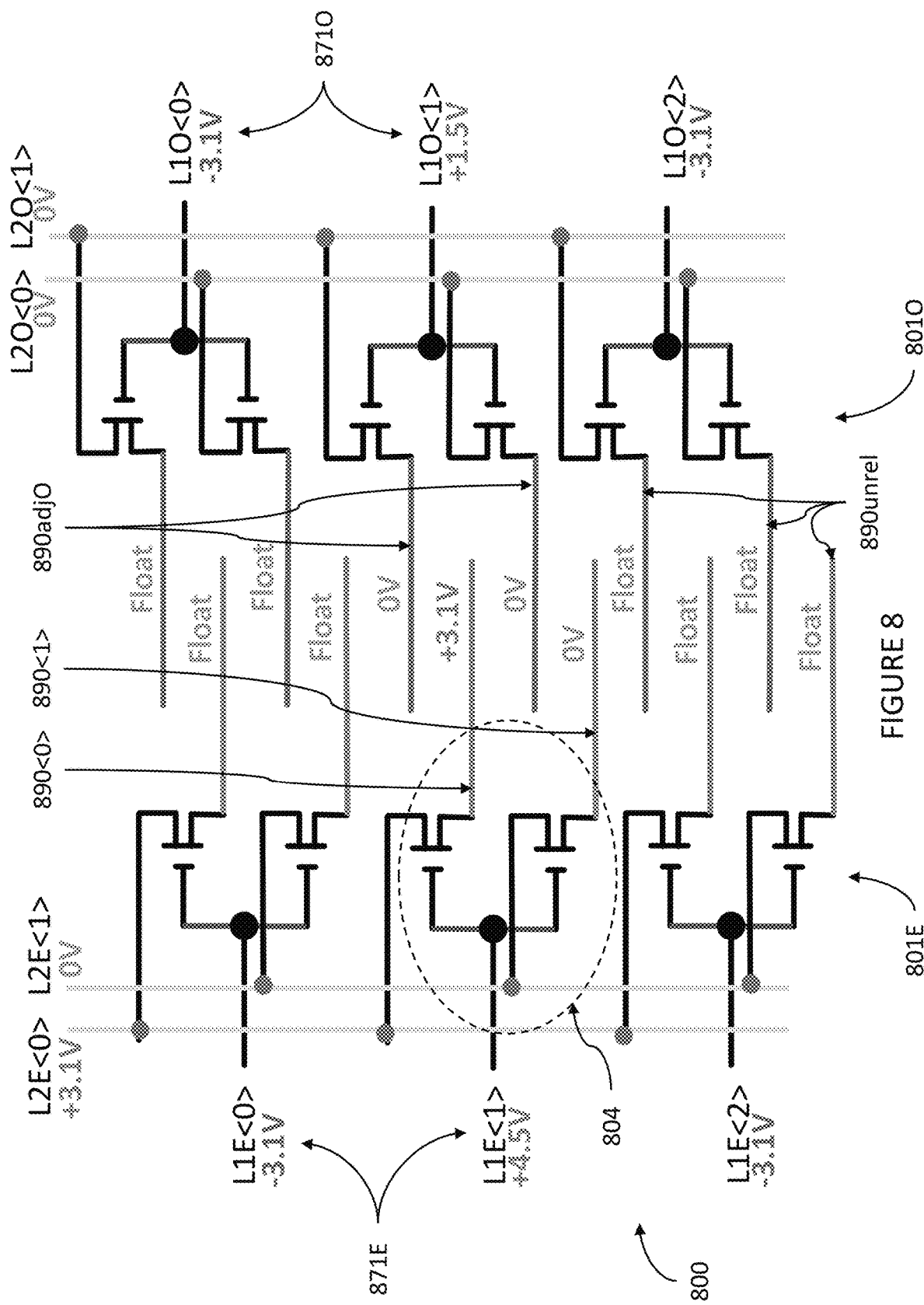
FIG. 8 illustrates an example configuration during a positive read/program phase of a memory device that supports single transistor drivers in accordance with embodiments of the present disclosure.

FIG. 8 illustrates an example configuration during a PULSE phase and more specifically during a positive read/program operation of a memory device that supports single transistor drivers in accordance with embodiments of the present disclosure. Elements in FIG. 8 correspond to equivalent elements in FIGS. 6 and 7 and the description will not be repeated; the same label convention is adopted (e.g., with respect to corresponding elements).

During a PULSE phase, the gate and drain control signal lines may be biased as depicted in FIG. 8 and summarized in Table I above. Different biasing conditions are desired for the addressed access line and the unaddressed access lines, that in turn are not to be all biased to the same voltages; therefore, corresponding rows in Table I must be considered based on the access line the single transistor driver is coupled to, with respect to the addressed line (e.g., the access line to which the read/program pulse is being applied to), as indicated in the second column of Table I.

A positive read/program voltage, e.g. +3.1V, may be applied to an addressed access line 890<0> by applying a pass gate voltage (e.g., +4.5V) to the gate control signal lines 871E named L1E<1> and by applying the desired positive read/program voltage (+3.1V) to the drain control signal lines L2E<0> (line PULSE—Read/Program Positive—Addressed, in Table I). The single transistor driver coupled to the addressed access line 890<0> may be in group 804 and it may share some control signals with other single transistor driver; for example, the gate control signal line L1E<1> is common with at least another single transistor driver in group 804 and the drain control signal line L2E<0> is also coupled to drain nodes of other single transistor drivers in different groups of the plurality of even drivers 801E. the management and handling of these common signals will be described in detail below.

A shielding voltage, e.g., a ground voltage, may be applied to one or more access line(s) 890adj physically adjacent to the addressed access line 890<0> by applying a pass gate voltage (e.g., +1.5V) to the gate control signal lines 871O named L1O<1> and by applying the desired shielding voltage (e.g., 0V) to the drain control signal lines L2O<0> and/or L2O<1> (line PULSE—Read/Program Positive—Adjacent to, in Table I). When the addressed access line 890<0> has on both sides adjacent access lines 890adj coupled to single transistor drivers that are grouped together (e.g., both driven by a same gate control signal line L1O<1>), as in the depicted example, it is sufficient to drive the common shared gate control signal line (e.g., L1O<1>) the gate pass voltage (e.g., 1.5V) to shield or ground both the adjacent access lines 890adjO. A different configuration will be discussed below with reference to FIG. 10.

A shielding voltage, e.g., a ground voltage, may be applied to one or more access line(s) 890<1> grouped with the addressed access line 890<0> in a same group 804 by applying the shared pass gate voltage (e.g., +4.5V) to the gate control signal lines 871E named L1E<1> and by applying the desired shielding voltage (e.g., 0V) to the drain control signal line L2E<1> (line PULSE—Read/Program Positive—Grouped with, in Table I).

A floating voltage, e.g., an unbiased voltage, may be applied to one or more access line(s) 890unrel that are unrelated to the addressed access line 890<0>; unrelated access lines 890unrel comprise access lines coupled to single transistor drivers in the plurality 801E in different groups than the addressed driver and/or access lines coupled to single transistor drivers in the plurality 801O in different groups than the driver(s) used to bias adjacent access lines to the shield voltage. The unrelated access lines 890unrel may be biased to the floating voltage by applying an inhibit gate voltage (e.g., −3.1V) to the gate control signal lines 871E named L1E<0>, L1E<2>, L1O<0> and L1O<2>; this will prevent biasing the access lines coupled to the corresponding drivers to any voltage, e.g., leave them float, irrespective of the voltage (+3.1V for even drivers or ground for odd drivers) at the drain node of the drivers (lines PULSE—Read/Program Positive—Unrelated, in Table I).

In all phases, the body node voltage may be kept at a constant voltage of, for example, −3.1V. Different voltage values for control signals, body and access lines may be used without departing from the scope of the invention.

Figure 9:
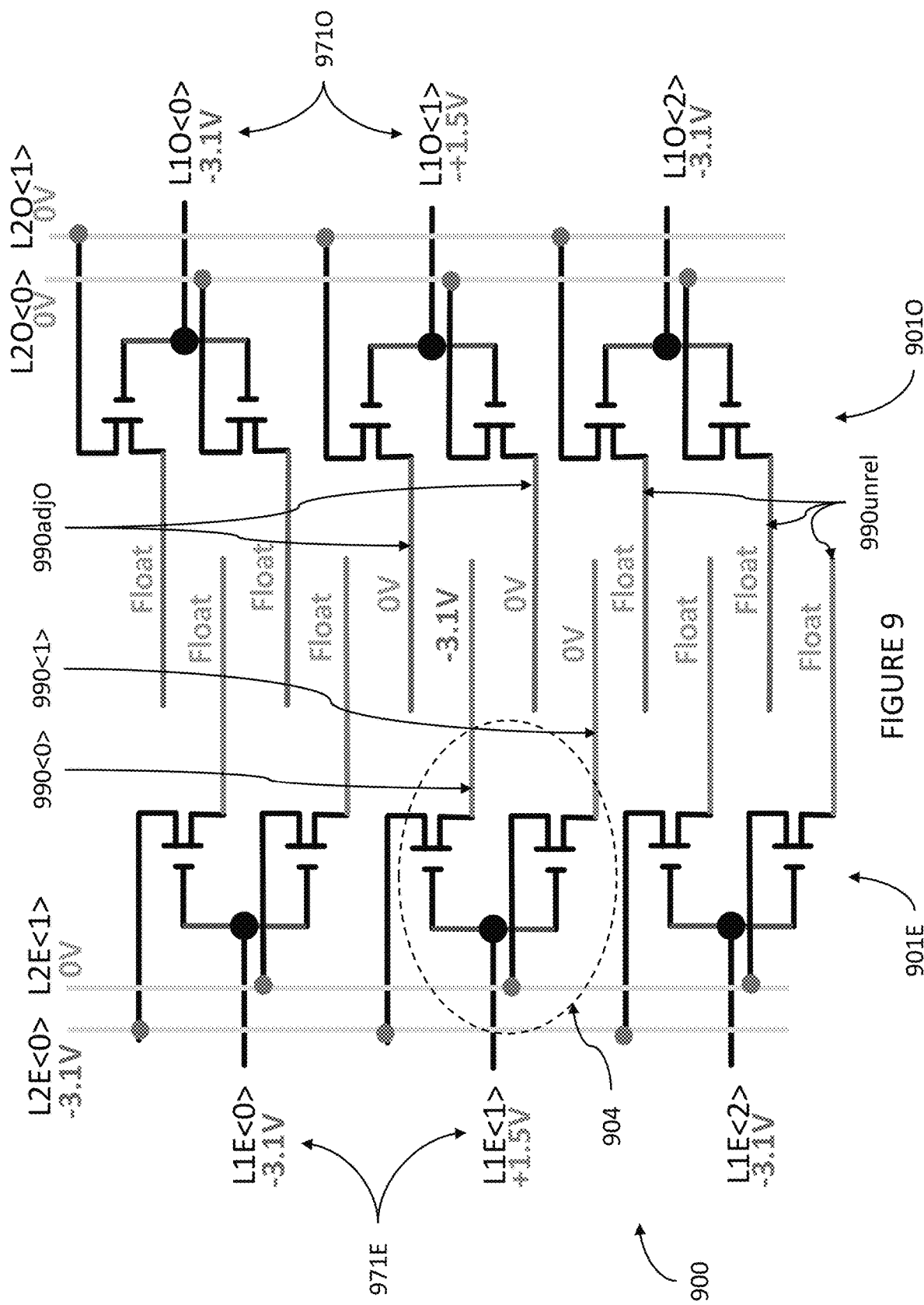
FIG. 9 illustrates an example configuration during a negative read/program phase of a memory device that supports single transistor drivers in accordance with embodiments of the present disclosure.

FIG. 9 illustrates an example configuration during a PULSE phase and more specifically during a negative read/program phase of a memory device that supports single transistor drivers in accordance with embodiments of the present disclosure. Elements in FIG. 9 correspond to equivalent elements in FIG. 6-8 and the description will not be repeated; the same label convention is adopted (e.g., with respect to corresponding elements).

FIG. 9 only differs from FIG. 8 in that the desired read/program voltage on the addressed access line 990<0> is negative (e.g., −3.1V) rather than positive (e.g., +3.1V). Accordingly, drain control signal line L2E<0> may be biased to the negative read/program voltage (e.g. −3.1V) and it may be transferred by applying a pass gate voltage (e.g., +1.5V) to the gate control signal lines 971E named L1E<1> (line PULSE—Read/Program Negative—Addressed, in Table I).

A shielding voltage, e.g., a ground voltage, may be applied to one or more access line(s) 990adj physically adjacent to the addressed access line 990<0> by applying the same voltages described above with respect to the positive voltage read/program PULSE phase, that will not be repeated here for brevity (line PULSE—Read/Program Negative—Adjacent to, in Table I).

A shielding voltage, e.g., a ground voltage, may be applied to one or more access line(s) 990<1> grouped with the addressed access line 990<0> in a same group 904 by applying the shared pass gate voltage (e.g., +1.5V) to the gate control signal lines 971E named L1E<1> and by applying the desired shielding voltage (e.g., 0V) to the drain control signal line L2E<1> (line PULSE—Read/Program Negative—Grouped with, in Table I).

A floating voltage, e.g., an unbiased voltage, may be applied to one or more access line(s) 990unrel that are unrelated to the addressed access line 990<0>. Biasing conditions to float unrelated access lines 990unrel are the same or at least similar to those described above for corresponding unrelated access line 890unrel described with reference to FIG. 8 and will not be repeated here for brevity (line PULSE—Read/Program Negative—Unrelated, in Table I).

In all phases, the body node voltage may be kept at a constant voltage of, for example, −3.1V. Different voltage values for control signals, body and access lines may be used without departing from the scope of the invention.

Figure 10:
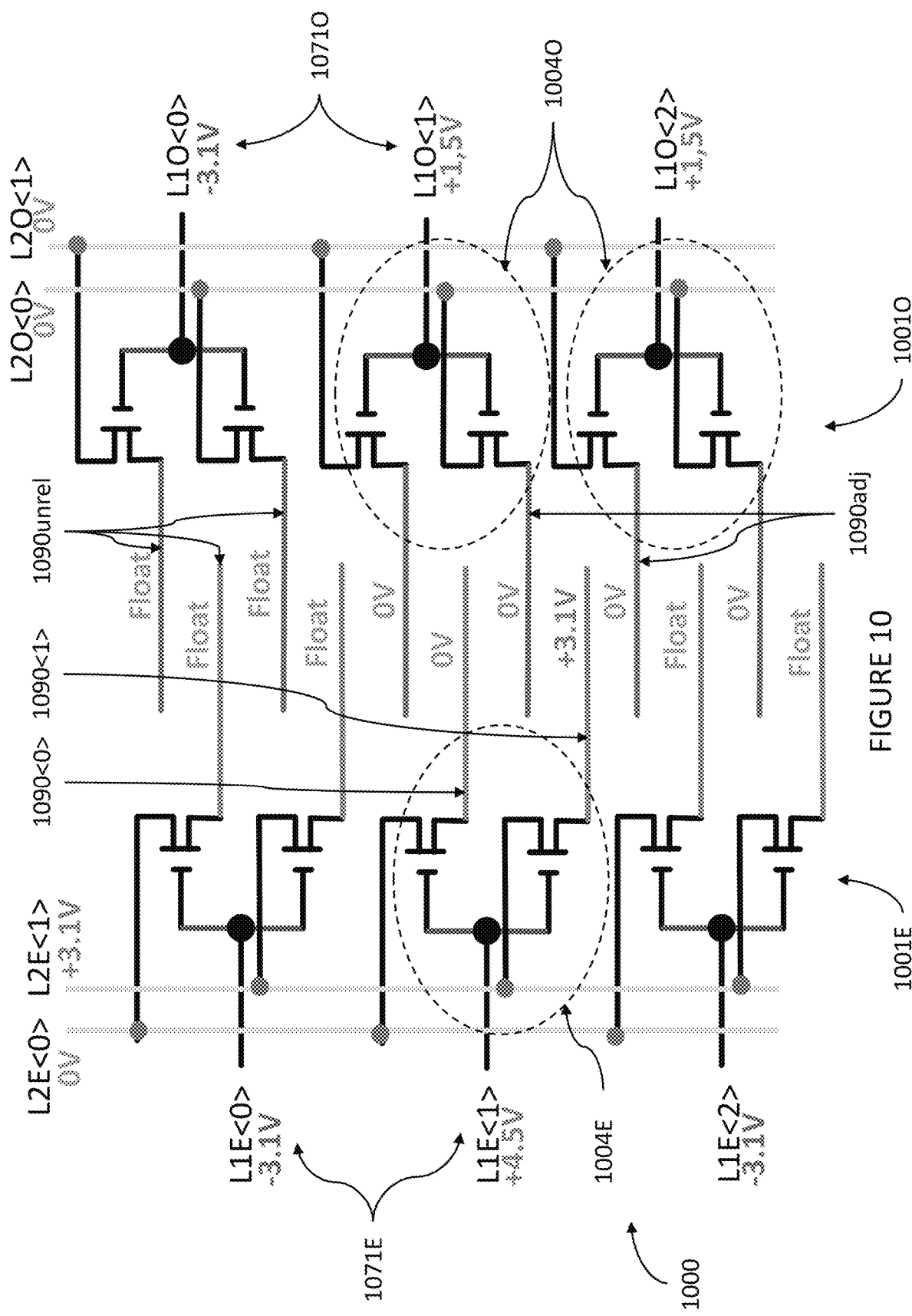
FIG. 10 illustrates another example configuration during a positive read/program phase of a memory device that supports single transistor drivers in accordance with embodiments of the present disclosure.

FIG. 10 illustrates another example configuration during a positive read/program phase of a memory device that supports single transistor drivers in accordance with embodiments of the present disclosure. Elements in FIG. 10 correspond to equivalent elements in FIG. 6-9 and the description will not be repeated; the same label convention is adopted (e.g., with respect to corresponding elements).

The configuration depicted in FIG. 10 is similar to the one depicted in FIG. 8; however, the addressed access line 1090<1> in FIG. 10 is coupled to a single transistor driver in group 1004E, the other single transistor driver coupled to the same group being also coupled to unaddressed access line 1090<0>. Since the target or addressed access line is different from the previous example (cfr. FIG. 8), the decoding and biasing voltages of gate L1E<1> and drain L2E<1> control signals may be different during a PULSE phase. With specific reference to a positive read/program operation a read/program voltage (e.g., +3.1V) may be applied to addressed access line 1090<1> by applying a pass gate voltage (e.g., +4.5V) to gate control signal line L1E<1> and a positive read/program voltage (e.g., +3.1V) to drain control signal line L2E<1> (line PULSE—Read/Program Positive—Addressed, in Table I).

Target or addressed access line 1090<1> has physically adjacent access lines 1090adj coupled to single transistor drivers belonging to two different groups 1004O of drivers 1001O. In other words, the addressed access line 1090<1>, contrary to addressed access line 890<0>, does not fall in between adjacent access lines 890adj of a same group and is rather at the border between adjacent access lines 1090adj of two groups 1004O. Accordingly, a shielding voltage, e.g., a ground voltage, may be applied to one or more access line(s) 890adj physically adjacent to the addressed access line 890<0> by applying a pass gate voltage (e.g., +1.5V) to the gate control signal lines 1071O named L1O<1> and to the one named L1O<2> (e.g., to the gate control signal lines coupled to both the groups the addressed access line 1090<1> borders to), and by applying the desired shielding voltage (e.g., 0V) to the drain control signal lines L2O<0> and/or L2O<1> (line PULSE—Read/Program Positive—Adjacent to, in Table I).

Other biasing conditions, e.g., for both unaddressed access line 1090<0> coupled to a single transistor driver in the same addressed group 1004E and unrelated access lines 1090unrel (either driven by even 1001E or by odd 1001O drivers) are unchanged with respect to the biasing conditions described with reference to FIG. 8 and will not be repeated here for brevity. In any case they are depicted in FIG. 10 and summarized in corresponding lines PULSE—Read/Program Positive—Grouped with (as far as unaddressed access line 1090<0>) and PULSE—Read/Program Positive—Unrelated (as far as unrelated access lines 1090unrel) of Table I. The body node voltage may be kept at a constant voltage of, for example, −3.1V, for all single driver transistors during the PULSE phase. Different voltage values for control signals, body and access lines may be used without departing from the scope of the invention.

Figure 11:
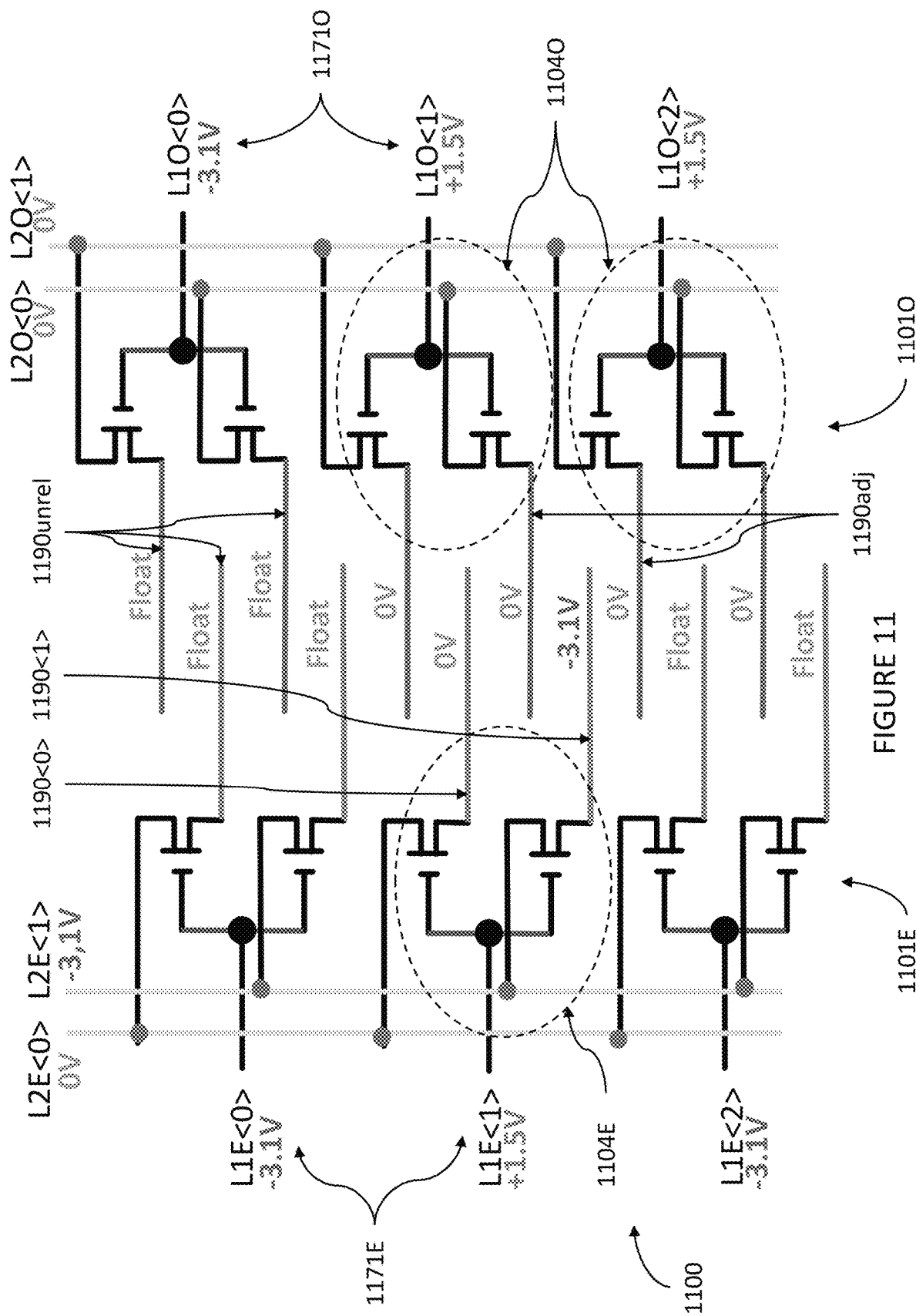
FIG. 11 illustrates another example configuration during a negative read/program phase of a memory device that supports single transistor drivers in accordance with embodiments of the present disclosure.

FIG. 11 illustrates another example configuration during a negative read/program phase of a memory device that supports single transistor drivers in accordance with embodiments of the present disclosure. Elements in FIG. 11 correspond to equivalent elements in FIG. 6-10 and the description will not be repeated; the same label convention is adopted (e.g., with respect to corresponding elements).

The configuration depicted in FIG. 11 is similar to the one depicted in FIG. 9; however, the addressed access line 1190<1> in FIG. 11 is coupled to a single transistor driver in group 1104E, the other single transistor driver coupled to the same group being also coupled to unaddressed access line 1190<0>. Since the target or addressed access line is different from the previous example (cfr. FIG. 9), the decoding and biasing voltages of gate L1E<1> and drain L2E<1> control signals may be different during a PULSE phase. With specific reference to a negative read/program operation a read/program voltage (e.g., −3.1V) may be applied to addressed access line 1190<1> by applying a pass gate voltage (e.g., +1.5V) to gate control signal line L1E<1> and a negative read/program voltage (e.g., −3.1V) to drain control signal line L2E<1> (line PULSE—Read/Program Negative—Addressed, in Table I).

Target or addressed access line 1190<1> has physically adjacent access lines 1190adj coupled to single transistor drivers belonging to two different groups 1104O of drivers 1101O. In other words, the addressed access line 1190<1>, contrary to addressed access line 990<0>, does not fall in between adjacent access lines 990adj of a same group and is rather at the border between adjacent access lines 1190adj of two groups 1104O. Accordingly, a shielding voltage, e.g., a ground voltage, may be applied to one or more access line(s) 1190adj physically adjacent to the addressed access line 1190<0> by applying a pass gate voltage (e.g., +1.5V) to the gate control signal lines 11710 named L1O<1> and to the one named L1O<2> (e.g., to the gate control signal lines coupled to both the groups the addressed access line 1190<1> borders to), and by applying the desired shielding voltage (e.g., 0V) to the drain control signal lines L2O<0> and/or L2O<1> (line PULSE—Read/Program Negative—Adjacent to, in Table I).

Other biasing conditions, e.g., for both unaddressed access line 1190<0> coupled to a single transistor driver in the same addressed group 1104E and unrelated access lines 1190unrel (either driven by even 1101E or by odd 1101O drivers) are unchanged with respect to the biasing conditions described with reference to FIG. 9 and will not be repeated here for brevity. In any case they are depicted in FIG. 11 and summarized in corresponding lines PULSE—Read/Program Negative—Grouped with (as far as unaddressed access line 1190<0>) and PULSE—Read/Program Negative—Unrelated (as far as unrelated access lines 1190unrel) of Table I. The body node voltage may be kept at a constant voltage of, for example, −3.1V, for all single driver transistors during the PULSE phase. Different voltage values for control signals, body and access lines may be used without departing from the scope of the invention.

The description above illustrates several aspects of the disclosed solution. In some examples, a memory device may comprise memory cells at cross points of access lines of a memory array, a first even single transistor driver configured to drive a first even access line to a discharging voltage (e.g., a ground voltage) during an IDLE phase, to drive the first even access line to a floating voltage (e.g., an unbiased voltage) during an ACTIVE phase, and to drive the first even access line to a read/program voltage (e.g., +3.1V or −3.1V) during a PULSE phase; the memory device may also comprise a first odd single transistor driver configured to drive a first odd access line, the first odd access line physically adjacent to the first even access line, to the discharging voltage during the IDLE phase, to drive the first odd access line to the floating voltage during the ACTIVE phase, and to drive the first odd access line to a shielding voltage (e.g., a ground voltage) during the PULSE phase.

In some embodiments, the first even/odd single transistor drivers have a respective gate coupled to an even/odd group gate driving line and a drain coupled to a first even/odd drain driving line; the memory device may further comprise respective second even/odd single transistor drivers with a gate coupled to the even/odd group gate driving lines and a drain coupled to a second even/odd drain driving line, configured to drive a second even/odd access line to the discharging voltage (e.g., 0V) during the IDLE phase, to drive the second even/odd access line to the floating voltage during the ACTIVE phase, and to drive the second even/odd access line to the shielding voltage (e.g., 0V) during the PULSE phase, the second odd access line physically adjacent to the first even access line.

In some embodiments, the memory device may comprise respective pluralities of even/odd drivers organized in even/odd groups, each driver coupled to a respective even/odd access line, the first even/odd single transistor driver in a first group of the plurality of even/odd drivers, wherein respective even access lines and respective odd access lines alternate in a deck of the memory device. The first even access line may be physically adjacent to a respective odd access line coupled to a second odd single transistor driver in the first group or in the second group of the plurality of odd drivers. The memory device may further comprise a second group of the plurality of even drivers and a second group of the plurality of odd drivers, the second groups of even and odd drivers configured to drive the respective even and odd access lines to the floating voltage during an ACTIVE phase and during the PULSE phase of the first even access line.

In some embodiments, the first even single transistor driver and the first odd single transistor driver are under the memory array. The first even single transistor driver and the first odd single transistor driver may each comprise one of a CMOS transistor, a FinFET transistor or a vertical TFT transistor. The first even single transistor driver comprises transistor nodes, and the memory device may further comprise a controller configured to drive transistor nodes to voltage differences not exceeding reliability transistor rating during any of the IDLE, ACTIVE and PULSE phases.

Figure 12:
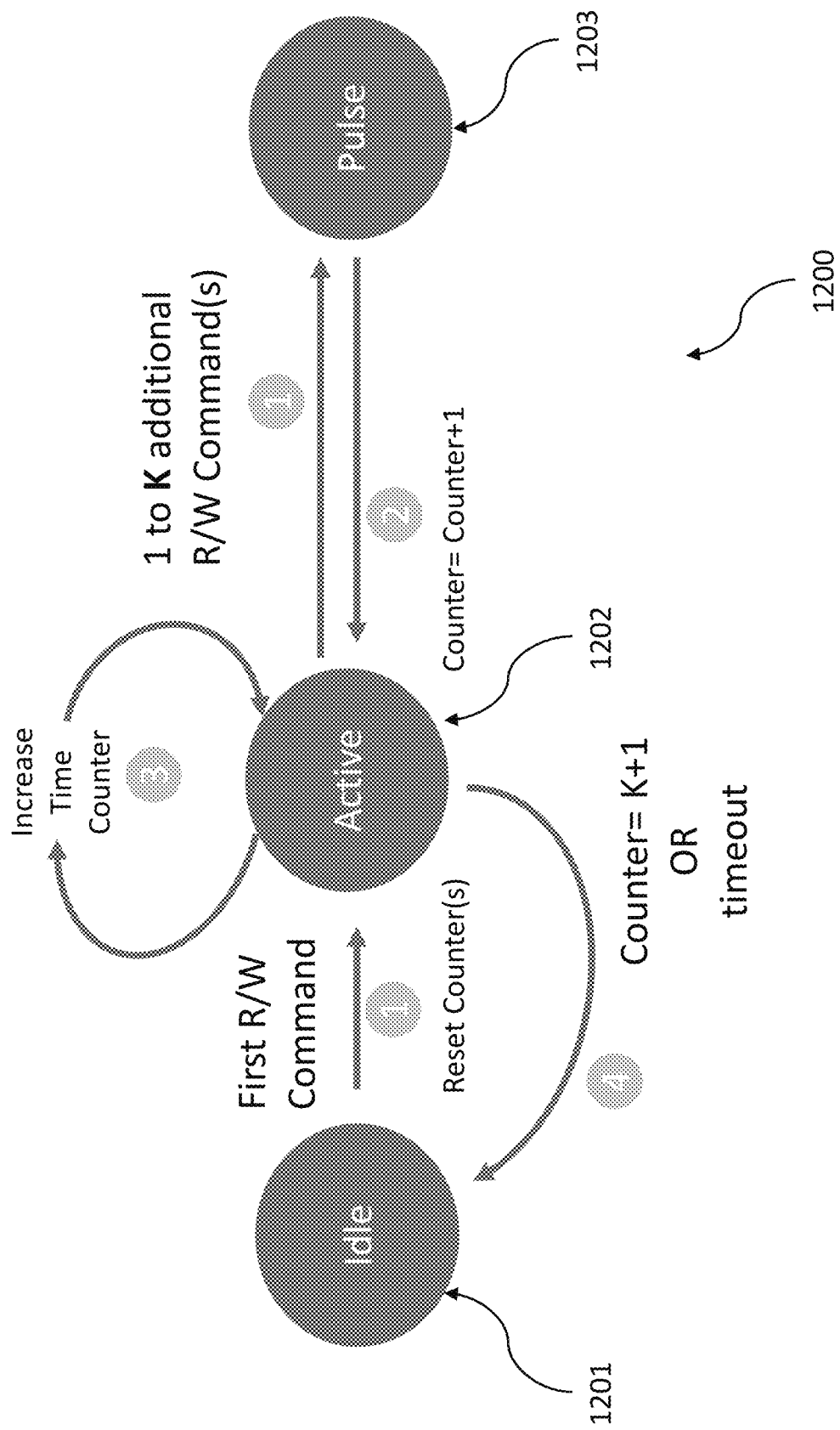
FIG. 12 illustrates a phase diagram of a memory device that supports single transistor drivers in accordance with embodiments of the present disclosure.
Figure 13:
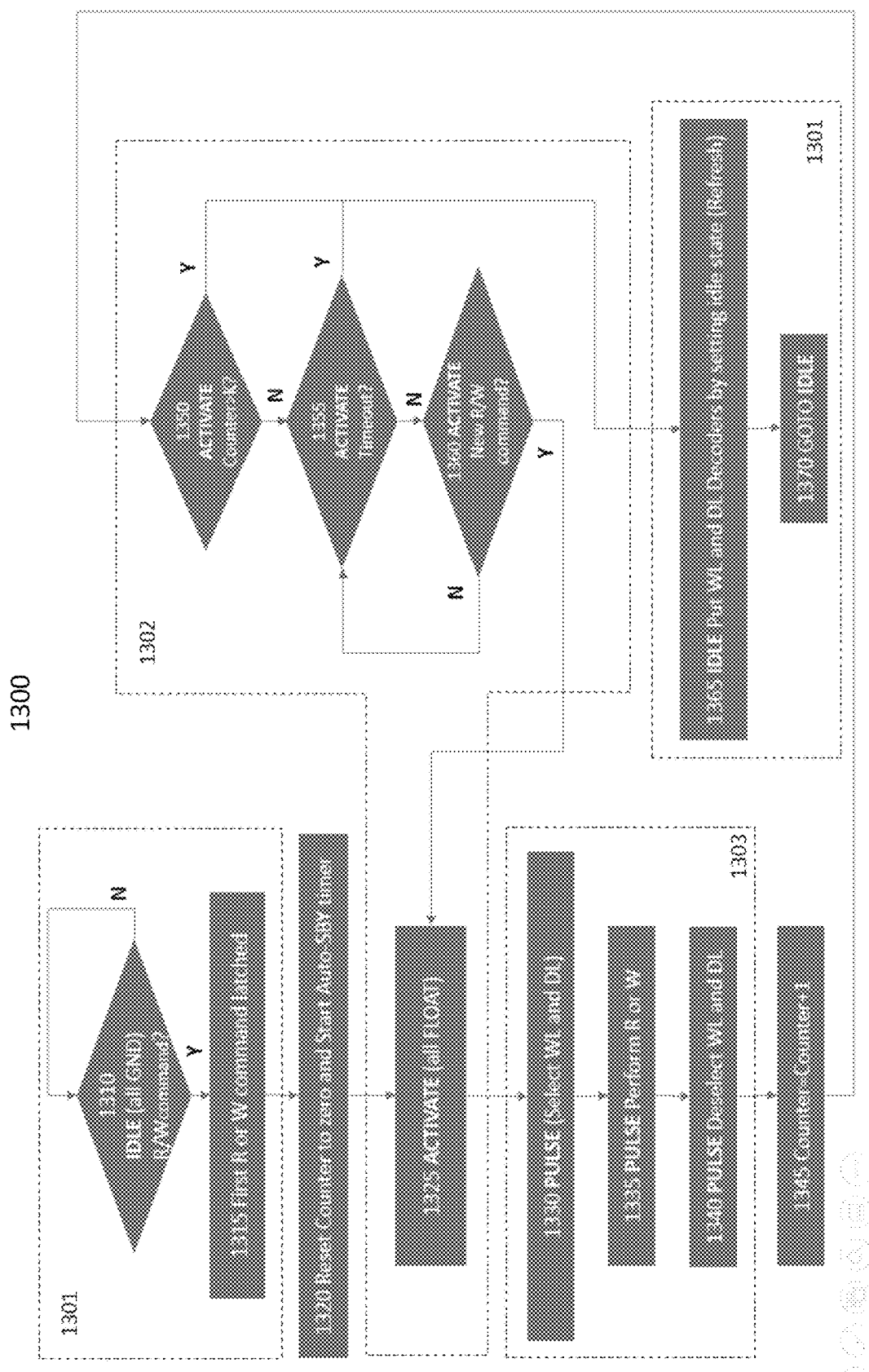
FIG. 13 illustrates a flow diagram of a method for a memory device that supports single transistor drivers in accordance with embodiments of the present disclosure.
Figure 14:
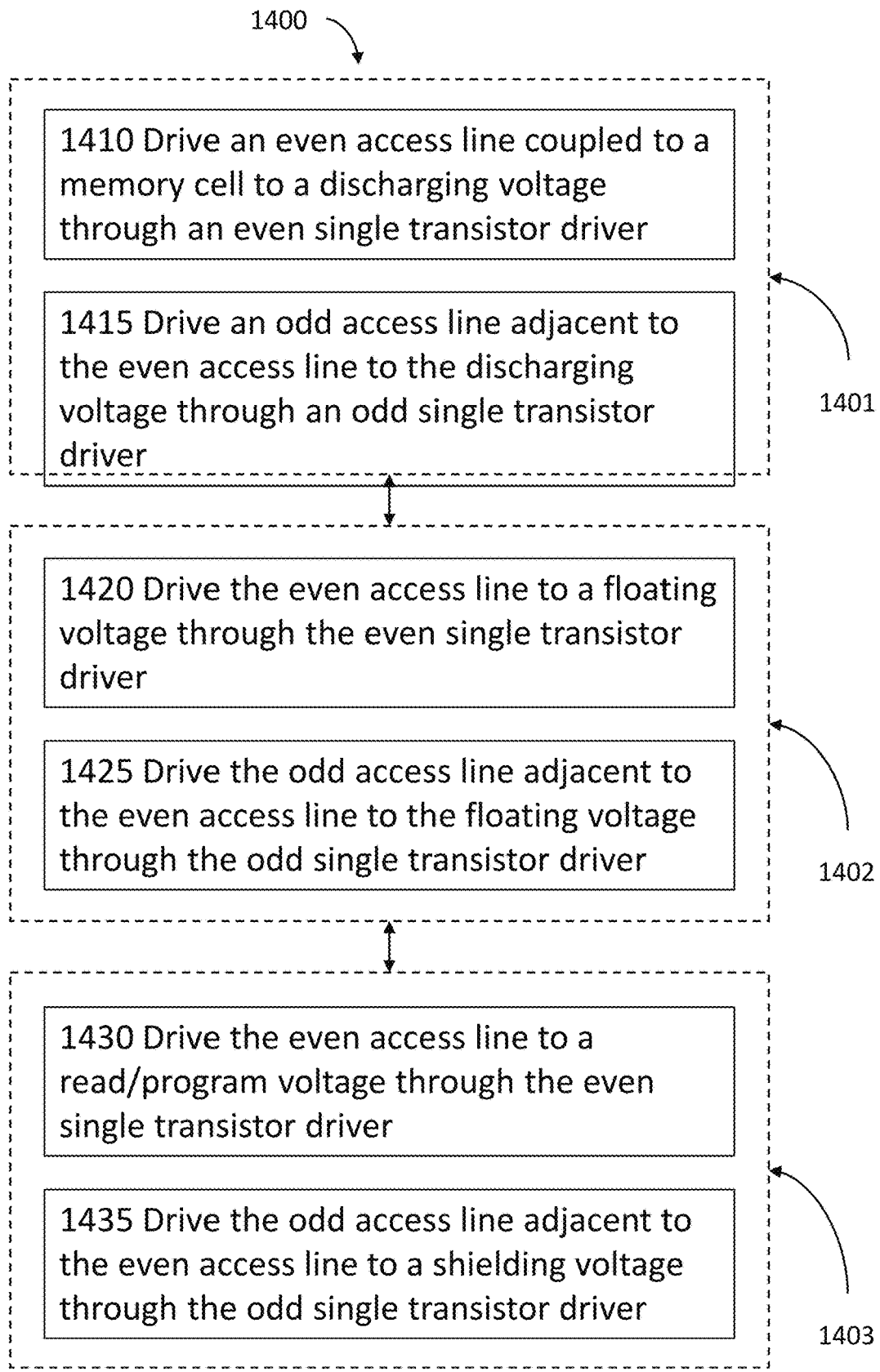
FIG. 14 illustrates a block diagram of a method for a memory device that supports single transistor drivers in accordance with embodiments of the present disclosure.

Operation of the memory device is now described in terms of a phase diagram and methods to operate the memory device, with reference to FIGS. 12-14.

FIG. 12 illustrates a phase diagram of a memory device that supports single transistor drivers in accordance with embodiments of the present disclosure. Phase diagram 1200 comprises an IDLE phase 1201, an ACTIVE phase 1202 and a PULSE phase 1203; other phases (not shown) may be present.

IDLE phase 1201 may be a phase during which the memory device is in a low consumption state, for example a standby state. A command, for example an access command such as a read or a program command, may be received during IDLE phase 1201 for execution by the memory device; other commands may be received during the IDLE phase. During IDLE phase 1201 it is desirable that all access lines in the memory array (for example access lines 110 and 115, 320 and 330, 690-1190, with reference to FIGS. 1, 3, and 6-11) are kept at a discharge voltage, such as a ground voltage, for example. This desired result may be obtained by controlling single transistor drivers as described above with reference to FIG. 6, for example.

ACTIVE phase 1202 may be a phase during which the memory device is ready to receive and/or execute a command; for example, an access command such as a read or a program command, may be received during ACTIVE phase 1202 for execution by the memory device. Other commands may be received during the ACTIVE phase. During ACTIVE phase 1202 it is desirable that all access lines in the memory array (for example access lines 110 and 115, 320 and 330, 690-1190, with reference to FIGS. 1, 3, and 6-11) are kept at a floating voltage; all access lines may by be insulated and unbiased, for example. This desired result may be obtained by controlling single transistor drivers as described above with reference to FIG. 7, for example.

PULSE phase 1203 may be a phase during which the memory device executes a command; for example, an access command such as a read or a program command. During PULSE phase 1203 the desired read/program voltage (e.g., +3.1V or −3.1V) may be applied to the target or addressed access line and access lines (for example, access lines 890adj-1190adj in FIGS. 8-11) physically adjacent to the addressed access line may be biased to a shielding voltage (e.g., a ground voltage); moreover, it is also desirable that unrelated access lines (for example access lines 890unrel-1190unrel in FIGS. 8-11) are kept to a floating. This desired result may be obtained by controlling single transistor drivers as described above with reference to FIGS. 8-11, for example. It should be noted any particular read/program pulse shape may be used; for example, ramped pulses, or staircase pulses, or pulses with different polarities and/or different voltage values may be applied during the PULSE phase.

As described in FIG. 12, transitions from the different phases may occur.

For example, when the memory device is in an IDLE phase, a transition from the IDLE phase 1201 to the ACTIVE phase 1202 may occur based on receiving a command, such as First R/W Command, that may be an access (e.g., read/program) command. This transition from IDLE to ACTIVE phases is indicated as 1 in FIG. 12. As a result of IDLE to ACTIVE transition 1, all access lines, initially grounded, are floated. Additionally, based on IDLE to ACTIVE phases transitioning 1, an access counter is reset and a timer is started. The access counter is a counter configured to store a number of access operations in the memory device or in a portion of the memory device, such as a bank, a partition, a tile, a page, etc., for example. Multiple counters may be present, each counter associated to a respective portion of the memory device (bank, partition, tile, page, etc.), in some embodiments. All counters may be reset on IDLE to ACTIVE transition 1. The timer may track time lapsed from last IDLE to ACTIVE transition time to present time, in some embodiments.

After IDLE to ACTIVE transition 1, the memory device is in ACTIVE phase. To complete execution of the received command, after IDLE to ACTIVE transition 1, ACTIVE to PULSE transition, also indicated as 1 in FIG. 12, may take place. As a result of the ACTIVE to PULSE transition 1, the target or addressed line is coupled to the read/program pulse generation circuitry, the access lines physically adjacent to the addressed access line or grouped to it are coupled to the shield voltage generation circuitry and the unrelated access lines are kept floating. As explained below, ACTIVE to PULSE transition 1 is allowed up to a count threshold (for example up to K read/program operations) or until lapsing of a time period, as determined by the timer.

After the ACTIVE to PULSE transition 1, the memory device in the PULSE phase and the read/program pulse may be applied to execute the command. Based on completion of applying the read/program pulse, the addressed access line may be grounded and a PULSE to ACTIVE transition 2 may take place. As a result of PULSE to ACTIVE transition 2 all access lines in the array are floated. Based on ACTIVE to PULSE transition 1, the relevant access counter (e.g., the sole counter and/or the counter associated to the addressed bank, partition, tile, page, etc.) is increased.

While in the ACTIVE phase 1202, for example waiting for a new read/program command, the timer is updated (e.g., a time-driven counter is increased). This ACTIVE to ACTIVE transition is indicated as 3 in FIG. 12. While in ACTIVE phase 1202, it may be checked whether the access counter has or has not exceed an access threshold (e.g., K access operations to the relevant memory portion). If the check results in the access counter meeting or exceeding the threshold, ACTIVE to IDLE transition, indicated with 4 in FIG. 12, is carried out. While in ACTIVE phase 1202, it may be checked whether the timer has or has not exceed a time threshold (e.g., a predefined period has lapsed since last IDLE to ACTIVE transition 1). If the check results in the access counter meeting or exceeding the threshold, ACTIVE to IDLE transition 4 is carried out. One or both of the check on access counter and the check on timer may take place; they are individually or in combination intended to avoid that the memory device stays in the ACTIVE phase after an excessively high number of access operations or for too long a time period, that might each or in combination induce possible voltage drift on otherwise floating access lines. As a result of the ACTIVE to IDLE transition 4, all the access lines in the memory array are biased to a discharge voltage (for example a ground voltage), therefore periodically refreshing a safe biasing condition of the array.

While in the ACTIVE phase 1202, a new command may be received, for example an access command such as a read/program command. Based on receiving a command, ACTIVE to PULSE transition 1 may directly take place and the read/program pulse may be applied as described above.

In all cases, PULSE phase 1203 (and corresponding read/program pulse) is entered from ACTIVE phase 1202 characterized by all access lines being floating. Accordingly, a considerable energy saving is obtained since it is not necessary to charge nor discharge unaddressed access lines, with the only exception of access lines adjacent to the addressed access line, that are biased to a shielding voltage (e.g., ground or 0V) to avoid disturbs induced on floating lines. Memory device normally may be in IDLE phase 1201 when no commands are received or are not received for a predefined time period and it may be in ACTIVE phase 1202 until the time period lapses after last IDLE to ACTIVE transition 1 occurred and/or a threshold value of access counts is met or exceeded.

FIG. 13 illustrates a flow diagram of a method for a memory device that supports single transistor drivers in accordance with embodiments of the present disclosure. Method 1300 comprises a number of steps that have been grouped, in the representation of FIG. 13, in IDLE phase 1301, ACTIVE phase 1302 and PULSE phase 1303, as well as other steps that may be carried out during transitions from one to another of the phases above. Method 1300 may comprise other phases and/or steps (not shown). Method 1300 may be implemented by a memory device 100 using single transistor drivers 400, 601E/601O-1101E/1101O as described with reference to FIGS. 1, 4, and 6-11 above and possibly configured to operate according to the description of phase diagram described in FIG. 12, in some examples.

Method 1300 may start at step 1310 when the memory device in an IDLE phase 1301 with all access lines grounded and waits for an access command (e.g., a read/program R/W command). Memory device stays at step 1310 (branch N) until the command is received and latched, at step 1315. Additionally, at step 1320, based on IDLE to ACTIVE phases transitioning, an access counter (e.g., Reset Counter) is reset to zero and a timer (e.g., Auto-SBY timer) is started. The Auto-SBY timer may track time lapsed from last IDLE to ACTIVE transition time to present time.

At step 1325 memory device is in an ACTIVE phase 1302 with all access lines floating and, based on the received R/W command, method 1300 continues to step 1330 when access lines (e.g., word lines and digit lines) are selected during a PULSE phase 1303. At step 1335 the Read or Program is performed (e.g., the read or program pulse is applied to the addressed access line(s)) and at step 1340 word line WL and digit line DL are deselected (e.g., the addressed access lines are grounded and then all access lines, including access lines adjacent to or grouped with the addressed access line are floated).

Method 1300 may continue at step 1345 when an access counter is increased. Memory device may return to the ACTIVE phase 1302 at step 1350 when the access counter is checked against a threshold. If the counter meets or exceeds the threshold (branch Y), method 1300 may continue at step 1365; if, on the contrary, the threshold is not met nor exceeded (branch N), a timeout check is carried out at step 1355 (e.g., by using a timer measuring time lapsed since last IDLE to ACTIVE transition). In case of timeout (branch Y), method 1300 continues at step 1365; in case of no timeout (branch N) memory device waits for a new command to be received at step 1360, iterating (branch) through timeout check at 1355 and command reception at 1360 until an exit condition is met. When a command, that may be an access command such as a read/program command, is received (branch Y of 1360), method 1300 continues at steps 1325 and 1330 already described above (leading to application of the read/program pulse during a PULSE phase 1303 and return to the ACTIVE phase 1302).

When method 1300 reaches step 1365 (for example because access counter meets or exceeds the threshold at step 1350, branch Y, or in case of timeout at step 1355, branch Y) word line WL and digit line DL decoders are configured to bias all access lines to a discharge voltage (e.g., a ground voltage) as it is the case during an IDLE phase 1301. Step 1370 simply reconnects the diagram in FIG. 13 to starting step 1310.

FIG. 14 illustrates a block diagram of a method for a memory device that supports single transistor drivers in accordance with embodiments of the present disclosure. Method 1400 comprises some steps, e.g., steps 1410 and 1415, that may be associated with an IDLE phase 1401, some steps, e.g., steps 1420 and 1425, that may be associated with an ACTIVE phase 1402, some steps, e.g., steps 1430 and 1435, that may be associated with a PULSE phase 1403. IDLE 1401, ACTIVE 1402, and PULSE 1403 phases may be examples of IDLE 1201, 1301, ACTIVE 1202, 1302, and PULSE 1203, 1303 phases described with reference to FIGS. 12 and 13 and/or IDLE, ACTIVE and PULSE phases respectively described in FIGS. 6, 7, and 8-11, Method 1400 may be implemented in a memory device, such as memory device 100 of FIG. 1, in some embodiments. In some examples, method 1400 may rely on single transistor drivers such as single transistor driver 400 of FIG. 4; in some embodiments, single transistor drivers may be grouped in groups 500, 604, and 804-1104, as described above with reference to FIG. 5-11.

Method 1400 may comprise, at step 1410, driving an even access line coupled to a memory cell to a discharging voltage through an even single transistor driver. In some embodiments, the discharging voltage may be a ground voltage, for example it may be 0V.

Method 1400 may comprise, at step 1415, driving an odd access line adjacent to the even access line to the discharging voltage through an odd single transistor driver. In some embodiments additional access lines (e.g., more access lines other than the even access line and the odd access line adjacent to the even access line) may be driven to the discharging voltage through respective single transistor drivers. In some cases, all the access lines of the memory array may be discharged, or grounded, for example during an IDLE phase 1401.

Method 1400 may comprise, at step 1420, driving the even access line to a floating voltage through the even single transistor driver. In some embodiments, the floating voltage may be an unbiased voltage, for example the floating voltage may substantially remain unchanged until a biasing voltage is applied.

Method 1400 may comprise, at step 1425, driving the odd access line adjacent to the even access line to the floating voltage through the odd single transistor driver. In some embodiments additional access lines (e.g., more access lines other than the even access line and the odd access line adjacent to the even access line) may be driven to the floating voltage through respective single transistor drivers. In some cases, all the access lines of the memory array may be floated, for example during an ACTIVE phase 1402.

Method 1400 may comprise, at step 1430, driving the even access line to a read/program voltage through the even single transistor driver. In some embodiments, the read/program voltage may be a positive read/program voltage (for example +3.1V). In some embodiments, the read/program voltage may be a negative read/program voltage (for example −3.1V).

Method 1400 may comprise, at step 1435, driving the odd access line adjacent to the even access line to a shielding voltage through the odd single transistor driver. In some embodiments, the shielding voltage may be a ground voltage, for example it may be 0V. In some embodiments, other access lines grouped with the even access line may be driven to the shielding voltage through respective single transistor drivers and/or other access lines that are unrelated to the (addressed) even access line may be driven to the floating voltage through respective single transistor drivers, for example during a PULSE phase 1403.

In some embodiments, method 1400 may further comprise (not illustrated in flow diagram of FIG. 14) selectively providing the discharge voltage, the read/write voltage and/or the shield voltage to the even and odd single transistor drivers through drain driving lines coupled to respective drain nodes of respective single transistors in the drivers. Additionally, method 1400 may further comprise selectively providing gate control signals to the even and odd single transistor drivers through gate driving lines coupled to respective gate nodes of respective single transistors in the drivers. In some cases, selectively providing the gate control signals comprises providing the gate control signals in parallel to a group of even or odd single transistor drivers and selectively providing the discharge voltage, the read/write voltage and/or the shield voltage comprises providing each of the discharge voltage, the read/write voltage and/or the shield voltage, in parallel to a plurality of even or odd single transistor drivers in different groups.

Providing the discharge voltage, the read/write voltage and/or the shield voltage, and providing the gate control signals may comprise biasing transistor nodes to voltage differences not exceeding reliability transistor rating during any of the IDLE, ACTIVE and PULSE phases.

In some embodiments, method 1400 may comprise receiving an access command, that may be one of a read or a write command to a memory portion of the array (e.g., a bank, a partition, a tile, a page, etc., or the memory array as a whole), and, if in the IDLE phase, transitioning the memory portion from the IDLE phase to the ACTIVE phase based on receiving the read or the write command, and then transitioning the memory portion from the ACTIVE phase to the PULSE phase, if in the ACTIVE phase, transitioning the memory portion from the ACTIVE phase to the PULSE phase based on receiving the read or the write command, executing the PULSE phase in the memory portion, increasing a read/program counter and returning the memory portion to the ACTIVE phase based on the executing, and maintaining the memory portion in the ACTIVE phase based on the read/program counter and/or a time counter not meeting respective threshold, or returning the memory portion to the IDLE phase based on the read/program counter or the time counter meeting respective threshold.

In method 1400, returning the memory portion to the ACTIVE phase based on the executing may comprise driving the even access line to the discharge voltage after driving the even access line to the read/program voltage. Additionally or alternatively, transitioning the memory portion from the IDLE phase to the ACTIVE phase may further comprise resetting the read/program counter and/or the time counter.

Figure 15:
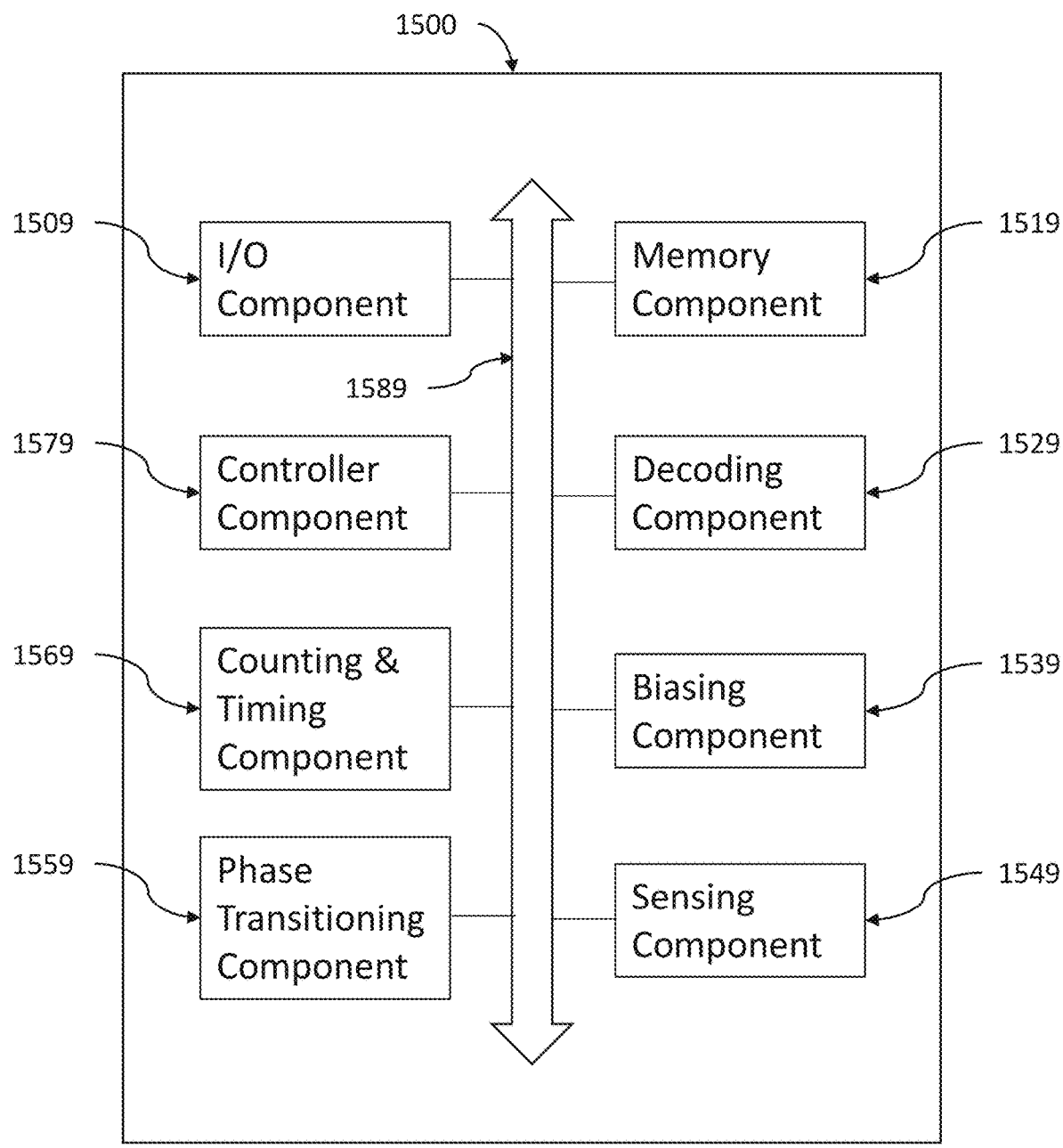
FIG. 15 illustrates a block diagram of a memory device that supports single transistor drivers in accordance with embodiments of the present disclosure.

FIG. 15 illustrates a block diagram of a memory device 1500 that supports single transistor drivers in accordance with embodiments of the present disclosure. Memory device 1500 may be an example of memory device 100, as described with reference to FIG. 1, in some embodiments. Memory device 1500 may be configured to implement methods 1300 and 1400 described above. In some embodiments, device 1500 may be configured to operate in some phases, such as an IDLE phase, an ACTIVE phase and a PULSE phase, among others, as described with reference to FIG. 12.

Memory device 1500 may comprise an Input/Output (I/O) component 1509, a memory component 1519, a decoding component 1529, a biasing component 1539, a sensing component 1549, a phase transitioning component 1559, a counting & timing component 1569 and a controller component 1579, among other components (not shown). The various components 1509-1579 may be coupled to each other through bus 1589.

I/O component 1509 may receive from and/or send to an external media manager (not shown) commands, addresses and/or data. For example, I/O component may receive an access command, such as a read or a program command, to access one or more memory cells in a memory array (e.g., memory cells in memory component 1519). I/O component may also receive memory cell address of the memory cell(s) to be accessed and, for example in case of a program command, data to be written to the memory cell(s). In another example, I/O component may transmit to the external media manager data retrieved from memory cells in the memory array as result of a read command previously received.

Memory component 1519 may comprise a memory array, for example one embodiment of memory array described above with reference to FIGS. 1-3 and 6-11. Memory component 1519 may also comprise decoders (e.g., row and column decoders) with access line drivers, for example single transistor drivers 400 as described above with reference to FIG. 4. Single transistor drivers may be organized and operated as described above with reference to FIGS. 5, 6-11 and 12-14.

Memory device 1500 may comprise decoding component 1529, that in some cases may be included in memory component 1519. Based on a memory cell address, decoding component 1529 may select access lines, e.g., word line(s) and digit line(s) coupled to the addressed memory cell(s) for biasing by biasing component 1539. Biasing component 1539, responsive to the command received by memory device 1500 and/or to a phase or state of the memory device 1500, may generate voltages to discharge, shield and/or read/program the memory cells in memory component 1519. Sensing component 1549 may sense memory cells in memory component 1519 and make a determination about one or more logic states stored therein.

Memory device 1500 may comprise phase transitioning component 1559, that may cooperate with other component in memory device 1500 to modify the device state, e.g., to transition from an IDLE to an ACTIVE phase, from an ACTIVE phase to a PULSE phase, from a PULSE phase to an ACTIVE phase and/or from an ACTIVE phase to an IDLE phase, for example, as described above. Counting & timing component 1569 may track the number of accesses to any memory portion in memory component 1519; for example the number of read and/or program operations from/into a bank, a partition, a tile, a page, etc., or the memory array as a whole. The number of accesses may be stored in a counter and used to determine whether the access count meets or exceeds a threshold. Counting & timing component 1569 may track time lapsed after a last IDLE to ACTIVE transition to determine a possible timeout. Based on either or both the access counter and timeout determinations, an ACTIVE to IDLE phase transition may be triggered by the phase transitioning component 1559.

Memory device 1500 may also comprise controller component 1579, that oversees global operation of memory device 1500 and, in particular, provides control signals and biasing voltages to single transistor drivers of access lines of the memory array.

Memory device 1500 may be an example of a system or may be a subsystem of a system comprising a memory array and a controller configured to drive an even access line coupled to a memory cell to a discharging voltage through an even single transistor driver, and to drive an odd access line adjacent to the even access line to the discharging voltage through an odd single transistor driver, during an IDLE phase, the controller also configured to drive the even access line to a floating voltage through the even single transistor driver, and drive the odd access line adjacent to the even access line to the floating voltage through the odd single transistor driver, during an ACTIVE phase, and the controller also configured to drive the even access line to a read/program voltage through the even single transistor driver, and drive the odd access line adjacent to the even access line to a shielding voltage through the odd single transistor driver, during a PULSE phase. These and other operating conditions have been described in detail above with reference to FIGS. 1-14.

The components of the device 1500 may include circuitry designed to carry out their functions. This may include various circuit elements, for example, conductive lines, transistors, capacitors, inductors, resistors, amplifiers, or other active or inactive elements, configured to carry out the functions described herein. The device 1500 may be a computer, a server, a laptop computer, a notebook computer, a tablet computer, a mobile phone, a wearable electronic device, a personal electronic device, or the like. Or the device 1500 may be a portion or element of such a device.

The description herein provides examples, and is not limiting of the scope, applicability, or examples set forth in the claims. Changes may be made in the function and arrangement of elements discussed without departing from the scope of the disclosure. Some examples may omit, substitute, or add various operations, procedures, or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (e.g., open, closed).

The phrase "coupled between" may refer to an order of components in relation to each other, and may refer to an electrical coupling. In one example, a component "B" that is electrically coupled between a component "A" and a component "C" may refer to an order of components of "A-B-C" or "C-B-A" in an electrical sense. In other words, electrical signals (e.g., voltage, charge, current) may be passed from component A to component C by way of component B.

A description of a component B being "coupled between" component A and component C should not necessarily be interpreted as precluding other intervening components in the described order. For example, a component "D" may be coupled between the described component A and component B (e.g., referring to an order of components of "A-D-B-C" or "C-B-D-A" as examples), while still supporting component B being electrically coupled between component A and component C. In other words, the use of the phrase "coupled between" should not be construed as necessarily referencing an exclusive sequential order.

Further, a description of component B being "coupled between" component A and component C does not preclude a second, different coupling between component A and component C. For example, component A and component C may be coupled with each other in a separate coupling that is electrically parallel with a coupling via component B. In another example, component A and component C may be coupled via another component "E" (e.g., component B being coupled between component A and component C and component E being coupled between component A and component C). In other words, the use of the phrase "coupled between" should not be construed as an exclusive coupling between components.

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "terminal" need not suggest a physical boundary or connection point of a circuit element. Rather, "terminal" may refer to a reference point of a circuit relevant to the circuit element, which may also be referred to as a "node" or "reference point."

The devices discussed herein, including memory device 100, array 200, and circuitry 300, and drivers 400 described with reference to FIGS. 1, 2, 3 and 4-5, and their combinations described n FIGS. 6-11, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, such as metals. The source and drain may be conductive and may comprise a heavily-doped, or degenerate semiconductor region. The source and drain may be separated by a lightly-doped semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (e.g., A and B and C).

As used herein, the term "substantially" means that the modified characteristic (e.g., a verb or adjective modified by the term "substantially") need not be absolute but is close enough so as to achieve the advantages of the characteristic, or close enough that the characteristic referred to is true in the context of the relevant aspects of the disclosure.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

The invention claimed is:

1. A memory device comprising:
memory cells at cross points of access lines of a memory array,
a first even single transistor driver configured to drive a first even access line to a discharging voltage during an IDLE phase, to drive the first even access line to a floating voltage during an ACTIVE phase, and to drive the first even access line to a read/program voltage during a PULSE phase,
a first odd single transistor driver configured to drive a first odd access line, the first odd access line physically adjacent to the first even access line, to the discharging voltage during the IDLE phase, to drive the first odd access line to the floating voltage during the ACTIVE phase, and to drive the first odd access line to a shielding voltage during the PULSE phase.

2. The memory device of claim 1 wherein:
the first even single transistor driver has a gate coupled to an even group gate driving line and a drain coupled to a first even drain driving line,
the first odd single transistor driver has a gate coupled to an odd group gate driving line and a drain coupled to a first odd drain driving line,
the memory device further comprising:
a second even single transistor driver with a gate coupled to the even group gate driving line and a drain coupled to a second even drain driving line, configured to drive a second even access line to the discharging voltage during the IDLE phase, to drive the second even access line to the floating voltage during the ACTIVE phase, and to drive the second even access line to the shielding voltage during the PULSE phase, a second odd single transistor driver with a gate coupled to the odd group gate driving line and a drain coupled to a second odd drain driving line, configured to drive a second odd access line to the discharging voltage during the IDLE phase, to drive the second odd access line to the floating voltage during the ACTIVE phase, and to drive the second odd access line to the shielding voltage during the PULSE phase, the second odd access line physically adjacent to the first even access line.

3. The memory device of claim 1, wherein:
the first even single transistor driver has a gate coupled to an even group gate driving line and a drain coupled to a first even drain driving line,
the first odd single transistor driver has a gate coupled to an odd group gate driving line and a drain coupled to a first odd drain driving line,
the memory device further comprising:
a second even single transistor driver with a gate coupled to the even group gate driving line and a drain coupled to a second even drain driving line, configured to drive a second even access line to the discharging voltage during the IDLE phase, to drive the second even access line to the floating voltage during the ACTIVE phase, and to drive the second even access line to the shielding voltage during the PULSE phase,
a second odd single transistor driver with a gate coupled to a second odd group gate driving line different from the odd group gate driving line and a drain coupled to a second odd drain driving line, configured to drive a second odd access line to the discharging voltage during the IDLE phase, to drive the second odd access line to the floating voltage during the ACTIVE phase, and to drive the second odd access line to the shielding voltage during the PULSE phase, the second odd access line physically adjacent to the first even access line.

4. The memory device of claim 1 comprising:
a plurality of even drivers organized in even groups, each driver coupled to a respective even access line, the first even single transistor driver in a first group of the plurality of even drivers,
a plurality of odd drivers organized in odd groups, each driver coupled to a respective odd access line, the first odd single transistor driver in a first group of the plurality of odd drivers,
wherein respective even access lines and respective odd access lines alternate in a deck of the memory device.

5. The memory device of claim 4, wherein:
the first even access line is physically adjacent to a respective odd access line coupled to a second odd single transistor driver in the first group of the plurality of odd drivers, or
the first even access line is physically adjacent to a respective odd access line coupled to a second odd single transistor driver in a second group of the plurality of odd drivers.

6. The memory device of claim 4 further comprising a second group of the plurality of even drivers and a second group of the plurality of odd drivers, the second groups of even and odd drivers configured to drive the respective even and odd access lines to the floating voltage during an ACTIVE phase and during the PULSE phase of the first even access line.

7. The memory device of claims 4 to 6, wherein each even/odd group of the plurality of even/odd drivers is coupled to a respective gate driving line, and a plurality of even/odd drain driving lines is coupled to corresponding ones even/odd drivers in each group of the plurality of even/odd drivers.

8. The memory device of claim 1 comprising a further single transistor driver configured to drive an orthogonal access line, substantially perpendicular to the first even access line, to the discharging voltage during the IDLE phase, to drive the orthogonal access line to a floating voltage during an ACTIVE phase, and to drive the orthogonal access line to a orthogonal [complementary] read/program voltage during the PULSE phase.

9. The memory device of claim 8, wherein the discharging voltage and the shielding voltage are a ground voltage, the read/program voltage is one of a positive voltage and a negative voltage, and the orthogonal read/program voltage has an opposite polarity than a polarity of the read/program voltage.

10. The memory device of claim 1, wherein the first even single transistor driver and the first odd single transistor driver are under the memory array.

11. The memory device of claim 1, wherein the first even single transistor driver and the first odd single transistor driver each comprise one of a CMOS transistor, a FinFET transistor or a vertical TFT transistor.

12. The memory device of claim 1, wherein the first even single transistor driver comprises transistor nodes, the memory device further comprising a controller configured to drive transistor nodes to voltage differences not exceeding reliability transistor rating during any of the IDLE, ACTIVE and PULSE phases.

13. The memory device of claim 1 further comprising a read/program counter, a time counter, the controller configured to:
implement a transition from the IDLE phase to the ACTIVE phase based on reception of a read or a write command, and then implement transition from the ACTIVE phase to the PULSE phase, or
implement a transition from the ACTIVE phase to the PULSE phase upon reception of a read or write command,
return to the ACTIVE phase upon completion of the read/program phase, and
remain in the ACTIVE phase if the read/program counter and the time counter are below respective threshold, or
return to IDLE phase if the read/program counter or the time counter meet respective threshold.

14. A method to operate a memory device comprising single transistor drivers, comprising:
during an IDLE phase:
driving an even access line coupled to a memory cell to a discharging voltage through an even single transistor driver, and
driving an odd access line adjacent to the even access line to the discharging voltage through an odd single transistor driver,
during an ACTIVE phase:
driving the even access line to a floating voltage through the even single transistor driver, and
driving the odd access line adjacent to the even access line to the floating voltage through the odd single transistor driver,
during a PULSE phase:
driving the even access line to a read/program voltage through the even single transistor driver, and
driving the odd access line adjacent to the even access line to a shielding voltage through the odd single transistor driver.

15. The method of claim 14 further comprising:
during a PULSE phase of the even access line, driving another access line adjacent to the even access line to the shielding voltage through a respective single transistor driver coupled to the another access line.

16. The method of claim 14 further comprising:
during a PULSE phase of the even access line, driving another access line not adjacent to the even access line to the floating voltage through a respective single transistor driver coupled to the another access line.

17. The method of claim 14 further comprising:
selectively providing the discharge voltage, the read/write voltage and/or the shield voltage to the even and odd single transistor drivers through drain driving lines coupled to respective drain nodes of respective single transistors in the drivers.

18. The method of claim 17 further comprising:
selectively providing gate control signals to the even and odd single transistor drivers through gate driving lines coupled to respective gate nodes of respective single transistors in the drivers.

19. The method of claim 18, wherein:
selectively providing the gate control signals comprises providing the gate control signals in parallel to a group of even or odd single transistor drivers, and
selectively providing the discharge voltage, the read/write voltage and/or the shield voltage comprises providing each of the discharge voltage, the read/write voltage and/or the shield voltage, in parallel to a plurality of even or odd single transistor drivers in different groups.

20. The method of claim 19 wherein the providing the discharge voltage, the read/write voltage and/or the shield voltage, and the providing the gate control signals comprise biasing transistor nodes to voltage differences not exceeding reliability transistor rating during any of the IDLE, ACTIVE and PULSE phases.

21. The method of claim 14, wherein the discharging voltage and the shielding voltage are a ground voltage and the read/program voltage is one of a positive voltage and a negative voltage.

22. The method of claim 14 further comprising:
receiving a read or a write command to a memory cell in a memory portion,
if in the IDLE phase, transitioning the memory portion from the IDLE phase to the ACTIVE phase based on receiving the read or the write command, and then transitioning [the memory bank] from the ACTIVE phase to the PULSE phase,
if in the ACTIVE phase, transitioning the memory portion from the ACTIVE phase to the PULSE phase based on receiving the read or the write command,
executing the PULSE phase in the memory portion, increasing a read/program counter and returning the memory portion to the ACTIVE phase based on the executing, and
maintaining the memory portion in the ACTIVE phase based on the read/program counter and/or a time counter not meeting respective threshold, or
returning the memory portion to the IDLE phase based on the read/program counter or the time counter meeting respective threshold.

23. The method of claim 22, wherein:
returning the memory portion to the ACTIVE phase based on the executing comprises driving the even access line to the discharge voltage after driving the even access line to the read/program voltage.

24. The method of claim 22, wherein transitioning the memory portion from the IDLE phase to the ACTIVE phase further comprises resetting the read/program counter and/or the time counter.

25. A system comprising a memory array and a controller configured to:
drive an even access line coupled to a memory cell to a discharging voltage through an even single transistor driver, and to drive an odd access line adjacent to the even access line to the discharging voltage through an odd single transistor driver, during an IDLE phase,
drive the even access line to a floating voltage through the even single transistor driver, and drive the odd access line adjacent to the even access line to the floating voltage through the odd single transistor driver, during an ACTIVE phase, and
drive the even access line to a read/program voltage through the even single transistor driver, and drive the odd access line adjacent to the even access line to a shielding voltage through the odd single transistor driver, during a PULSE phase.

* * * * *